(12) United States Patent
Kemppinen et al.

(10) Patent No.: US 12,283,995 B2
(45) Date of Patent: Apr. 22, 2025

(54) CRYOGENIC WAVEFORM SOURCE

(71) Applicant: Teknologian tutkimuskeskus VTT Oy, Espoo (FI)

(72) Inventors: Antti Kemppinen, Espoo (FI); Jaani Nissilä, Espoo (FI); Jukka Viheriälä, Lempäälä (FI); Joonas Govenius, Espoo (FI)

(73) Assignee: Teknologian tutkimuskeskus VTT Oy, Espoo (FI)

( * ) Notice: Subject to any disclaimer, the term of this patent is extended or adjusted under 35 U.S.C. 154(b) by 101 days.

(21) Appl. No.: 18/001,901

(22) PCT Filed: Jun. 16, 2021

(86) PCT No.: PCT/FI2021/050456
§ 371 (c)(1),
(2) Date: Dec. 15, 2022

(87) PCT Pub. No.: WO2021/255344
PCT Pub. Date: Dec. 22, 2021

(65) Prior Publication Data
US 2023/0231631 A1   Jul. 20, 2023

(30) Foreign Application Priority Data

Jun. 16, 2020 (FI) .................................. 20205635

(51) Int. Cl.
*H04B 10/508* (2013.01)
*G06N 10/40* (2022.01)
(Continued)

(52) U.S. Cl.
CPC .......... *H04B 10/508* (2013.01); *G06N 10/40* (2022.01); *H03K 3/42* (2013.01); *H04B 10/516* (2013.01);
(Continued)

(58) Field of Classification Search
CPC .... H04B 10/508; H04B 10/516; H04B 10/70; G06N 10/40; H03K 3/42; H01L 27/1443;
(Continued)

(56) References Cited

U.S. PATENT DOCUMENTS

| 4,810,978 A | * | 3/1989 | Sato | G01S 3/784 |
| | | | | 374/161 |
| 5,271,074 A | * | 12/1993 | Tocci | G01D 5/268 |
| | | | | 385/12 |

(Continued)

FOREIGN PATENT DOCUMENTS

| EP | 0323508 A1 | 7/1989 |
| EP | 1569367 A2 | 8/2005 |

(Continued)

OTHER PUBLICATIONS

Finnish Patent and Registration Office, Office Action, Application No. 20205635, mailed Dec. 2, 2021, 9 pages.
(Continued)

*Primary Examiner* — Abbas H Alagheband
(74) *Attorney, Agent, or Firm* — Ziegler IP Law Group, LLC.

(57) ABSTRACT

A method for providing an electric waveform at a cryogenic temperatures includes
- providing an optical signal, which comprises an optical waveform,
- guiding the optical signal into a cryogenic chamber, and
- converting the optical waveform of the optical signal into an electric waveform inside the cryogenic chamber.

15 Claims, 17 Drawing Sheets

(51) Int. Cl.
  *H01L 27/144* (2006.01)
  *H03K 3/42* (2006.01)
  *H04B 10/516* (2013.01)
  *H04B 10/70* (2013.01)
  *H10N 69/00* (2023.01)

(52) U.S. Cl.
  CPC .......... *H04B 10/70* (2013.01); *H01L 27/1443* (2013.01); *H01L 27/1446* (2013.01); *H10N 69/00* (2023.02)

(58) Field of Classification Search
  CPC ... H01L 27/1446; H01L 27/144; H10N 69/00; H10N 60/84; G02B 2006/121; G02B 6/122; G02B 6/12; G02F 2201/20; G02F 1/225; B82Y 20/00
  USPC .......................................................... 398/140
  See application file for complete search history.

(56) References Cited

U.S. PATENT DOCUMENTS

| | | | |
|---|---|---|---|
| 10,379,420 B1* | 8/2019 | Wang | H03K 3/42 |
| 11,333,557 B2* | 5/2022 | Uyeno | G01J 5/025 |
| 2002/0067747 A1 | 6/2002 | Jalali et al. | |
| 2020/0052183 A1* | 2/2020 | Shainline | G06N 3/067 |
| 2021/0333154 A1* | 10/2021 | Uyeno | G01J 5/061 |

FOREIGN PATENT DOCUMENTS

| | | | | |
|---|---|---|---|---|
| JP | 2000155052 A | 6/2000 | | |
| WO | 8900323 A1 | 1/1989 | | |
| WO | WO-2008024910 A2 * | 2/2008 | .......... | G01F 23/292 |

OTHER PUBLICATIONS

Gran et al. "An Optically-Powered Current Source Operating Under Cryogenic Conditions" Proceedings of the 2012 Conference on Precision Electromagnetic Measurements, Jul. 30, 2012, DOI: 10.1109/CPEM.2012.6250658, 2 pages.

International Search Report, European Patent Office, Application No. PCT/FI2021/050456, mailed Aug. 23, 2021, 13 pages.

Ireland et al. An Optoelectronic Pulse Drive for Quantum Voltage Synthesizer, IEEE Transactions on Instrumentation and Measurement, vol. 68, No. 6, Jun. 2019, 6 pages.

Kahl et al. "Spectrally multiplexed single-photon detection with hybrid superconducting nanophotonic circuits" Optica, vol. 4, No. 5 publised May 19, 2017, Optical Society of America https://doi.org/10.1364/OPTICA.4.000557, 6 pages.

Nissila et al, "Driving a Josephson junction array with a mode-locked laser and a photodiode" Proceedings of the 2018 Conference on Precision Electromagnetic Mesurements (CPEM 2012), Oct. 22, 2018, DOI: 10.1109/CPEM.2018.8501122, 2 pages.

You et al. "Shaping the response pulse of superconducting nanowire single photon detection with a snubber" Applied Physics Letters, Oct. 15, 2009, vol. 95, DOI: 10.1063/1.3250169, 4 pages.

European Patent Office, Communication pursuant to Article 94(3) EPC, Application No. 21735338.2-1207, Mailed Sep. 20, 2024, 6 pages.

* cited by examiner

CRYOGENIC WAVEFORM SOURCE

FIELD

The aspects of the disclosed embodiments relate to forming an electric waveform.

BACKGROUND

The operation of a quantum computer may require providing an electric waveform with a high bandwidth.

The electric waveform may be needed at a cryogenic temperature, e.g. at a temperature which is lower than 5 K, or even lower than 1 K. Critical components of a quantum computer may operate at a cryogenic temperature, e.g. at a temperature which is lower than 5 K, or even lower than 1 K.

The electric waveform may be generated at the room temperature, wherein the generated electric waveform may be guided into a cryogenic chamber via an electric feedthrough and via a coaxial cable. However, the electric feedthrough and the cable may conduct heat into the cryogenic chamber to such an extent that that the heating power of the feedthrough exceeds the cooling capacity of state-of-the-art refrigerators. Guiding the high frequency electric signal into the cryogenic chamber may generate heat, which may disturb or prevent maintaining the desired cryogenic temperature of the cryogenic chamber. The Wiedemann-Franz law states that in metals, the heat and electrical conductivity are proportional to each other, since the heat is mostly mediated by electrons. The limited cooling capacity and the significant amount of heat conducted via the feedthrough sets fundamental limitations for both delivering electric RF signals and electric data signals from room temperature to a cryogenic temperature.

SUMMARY

An object is to provide a method for generating an electric waveform. An object is to provide a signal generator apparatus for providing an electric waveform.

According to an aspect, there is provided a method for providing an electric waveform (V(t), EPAT1), the method comprising:
- providing a first optical signal (CLB1), which comprises one or more sequences (OPAT1, OPAT2) of optical pulses,
- guiding the first optical signal (CLB1) into a cryogenic chamber (VES1),
- distributing the optical pulses of the first optical signal (CLB1) via optical waveguides (CWG1, CWG2) to two or more optical-to-electrical converter devices (OEC1, OEC2), and
- converting the optical pulses of the first optical signal (CLB1) into electric pulses inside the cryogenic chamber (VES1), wherein the temperature ($T_1$) inside the cryogenic chamber (VES1) is lower than 20 K.

The scope of protection sought for various embodiments of the present disclosure is set out by the independent claims. The embodiments, if any, described in this specification that do not fall under the scope of the independent claims are to be interpreted as examples useful for understanding various embodiments of the present disclosure.

The signal generator apparatus may comprise an optical pulse generator to provide optical pulses, an optical feedthrough to guide the optical pulses into a cryogenic chamber, and at least one optical-to-electrical converter to convert the optical pulses into electrical pulses inside the cryogenic chamber.

The signal generator apparatus may provide a selectable and/or an arbitrary voltage waveform. The signal generator apparatus may operate as an optically driven ultrafast cryogenic arbitrary waveform source. The signal generator apparatus may produce signal frequencies e.g. from 0 Hz to above 100 GHz.

The apparatus may be arranged to provide a selectable electrical waveform. The apparatus may be arranged to provide a user-selectable electrical waveform. The apparatus may be arranged to provide an arbitrary electrical waveform.

Conversion of optical pulses into electrical pulses at the cryogenic temperature may enable high bandwidth with good energy efficiency. The good energy efficiency of the signal generator apparatus may facilitate maintaining the cryogenic temperature of the cryogenic chamber. The thermal power conducted via the optical feedthrough into the cryogenic chamber may be so low that it does not exceed the limited cooling capacity of cooling system of the cryogenic chamber.

Guiding the high frequency signal into the cryogenic chamber via an optical feedthrough and conversion of optical pulses into electrical pulses inside the cryogenic chamber may allow reducing leakage of heat into the cryogenic chamber. Conduction of heat via an electric feedthrough into the cryogenic chamber may be reduced or minimized as it is not necessary to guide a high-frequency electric waveform into the cryogenic chamber.

The optical feedthrough may enable a higher bandwidth, when compared with the bandwidth enabled by an electric feedthrough.

The optical arbitrary pulse pattern generator may be arranged to generate a pattern of pulses with a very high frequency, even above 100 GHz.

The optical pulse generator may generate an optical binary pulse pattern where logical pulses occur at a fixed frequency, and wherein the signal level of each logical pulse may be 0 or 1. An existing pulse may correspond to the signal level 1. A missing pulse or an attenuated pulse may correspond to the signal level 0. Some of the optical pulses may represent the logical level one (1), i.e., a pulse exists, and the other optical pulses may represent the logical level zero (0), i.e., a pulse does not exist. When these pulses are coupled to a fast optical-to-electrical converter, each existing optical pulse may be converted into an electrical pulse. As a result, the apparatus may provide an electrical arbitrary pulse pattern.

The electrical pulse pattern may be low-pass filtered to provide a filtered output. The instantaneous voltage level of the filtered output may be proportional to the frequency of the existing optical pulses (logical level one). Thus, the instantaneous voltage level of the filtered output may be controlled by selecting the frequency of the existing optical pulses. The signal generator apparatus may comprise one or more ultrafast optical-to-electrical converters and one or more low pass filters to generate an electric waveform by delta-sigma conversion at a cryogenic temperature.

The optical-to-electrical converter may be e.g. a photodiode, a plasmonic photodetector or a nanowire detector to convert optical pulses into electrical pulses. A low pass filter may form an output waveform from the electrical pulses. The apparatus may comprise an electric low pass filter to convert a frequency of electrical pulses into a voltage level of an electric output waveform. The cut-off frequency of the low-pass filter may be smaller than the frequency of the electrical pulses. The low-pass filter may eliminate ultrafast signal components and may ensure that the voltage level of the output signal is proportional to the frequency of the optical pulses, which represent the signal level 1.

The apparatus may convert a digital optical signal into an analog electric waveform. The apparatus may operate as a digital-to-analog converter. The apparatus may perform delta-sigma conversion by filtering output signals of one or more optical-to-electrical converter units with the low pass filter.

In an embodiment, the outputs of several optical-to-electrical converters may be combined e.g. in order to increase the signal output magnitude, to improve signal dynamic range, and/or to increase the effective pulse frequency above the bandwidth of a single optical-to-electrical converter. The outputs may be combined e.g. by connecting the outputs in series. The outputs may be combined e.g. by connecting the outputs in parallel.

An optical signal may be guided to an optical-to-electrical converter via an optical waveguide. The optical signal may be distributed to several optical-to-electrical converters. In an embodiment, one or more optical waveguides and one or more optical-to-electrical converters may be implemented on the same substrate.

The operation of one or more optical-to-electrical converters may be enabled and disabled with a control signal. The operation of one or more optical-to-electrical converter units may be controlled e.g. by one or more control signals. Each control signal may be coupled to one or more optical-to-electrical converter units. The one or more control signals may allow selecting the number of active optical-to-electrical converters, which are enabled to convert optical pulses into electrical pulses. The one or more control signals may allow selecting the number of disabled optical-to-electrical converters, respectively. In particular, a first control signal may be arranged to enable and disable operation of a first group optical-to-electrical converters, and a second control signal may be arranged to enable and disable operation of a second group optical-to-electrical converters. The converters of the first group may be connected in series with the converters of the second group, e.g. to improve signal dynamic range.

In an embodiment, one or more optical multiplexing techniques may be used to deliver different optical pulse patterns to different optical-to-electrical converters. For example, wavelength division de-multiplexing (WDM) may be used to deliver optical pulses of different wavelengths to different optical-to-electrical converters. For example, time division multiplexing (TDM) together with wavelength division de-multiplexing (WDM) may be used to deliver optical pulses of different wavelengths to different optical-to-electrical converters.

Thus, the total pulse frequency of an optical signal may exceed the upper limit of the bandwidth of a single optical-to-electrical converter, in a situation where the pulse frequency in a single branch is lower than the upper limit.

Some of the optical-to-electrical converters may be biased with an opposite polarity, which allows both positive and negative output signals. The apparatus may comprise several optical-to-electrical converters. One or more optical-to-electrical converters may be arranged to provide an output, which has first polarity, and one or more optical-to-electrical converters may be arranged to provide an output, which has second opposite polarity. The outputs of different polarities may be combined to provide both positive and negative output signal voltages. The outputs may be combined e.g. using optical-to-electrical converters which are connected in series and/or which are connected in parallel.

The apparatus may comprise one or more optical-to-electrical converters to convert an optical pulse into an electrical pulse at the cryogenic temperature. The optical-to-electrical converter may be e.g. a uni-traveling-carrier photodiode (UTC-PD), a plasmonic photodetector, or a superconducting nanowire single-photon detector (SNSPD).

In particular, a nanowire detector may have high efficiency for converting optical energy into electrical energy. The high efficiency of the nanowire detector may be advantageous e.g. when cooling the cryogenic chamber to temperatures lower than 1 K. The response curve of a nanowire detector may have a fast rise time (e.g. <50 ps), but a long tail (>ns). The long tail of the response of the nanowire detector may set an upper limit of the bandwidth of a single nanowire detector. The upper limit of the bandwidth may be increased e.g. by shortening the temporal width of the response of the nanowire detector. The pulse may be shortened e.g. by using an inverting delay line to clip the tail of the response. An electric pulse provided by a nanowire detector may be shortened e.g. by adding an inverted delayed pulse to said electric pulse.

In an embodiment, the apparatus may comprise a superconducting delay line to form the delayed inverted pulse from the original voltage pulse. A first end of the delay line may operate as an input for the original voltage pulse and as an output for the delayed inverted pulse. The second end of the delay line may operate as a short-circuit, which may reflect and invert the voltage pulse which propagates along the delay line. The reflected inverted pulse may be delayed by a delay time. The delay time may be determined by the length of a transmission line of the delay line. The delayed inverted pulse may be added to the original voltage pulse after the delay time. In this way, it may be possible to reduce the temporal width of the voltage pulse. The temporal width of the shortened voltage pulse may be e.g. in the range of 10 ps to 50 ps.

By properly arranging the arrival times of optical pulses into a set of nanowire detectors equipped with this pulse tail clipper, an arbitrary pulse pattern could be generated at a rate of tens of GHz. An arbitrary electric pulse pattern may be generated by interlacing the arrival times of optical pulses into a set of optical-to-electrical converters. Electrical output signals of the optical-to-electrical converters may be combined to form the arbitrary electric pulse pattern.

Each optical-to-electrical converter unit may be optionally used together with an inverting delay line. The inverting delay line may be arranged to operate as a pulse tail clipper.

The inverting delay lines may shorten the pulse width so that the modulation frequency of the arbitrary electric pulse pattern may be e.g. greater than 20 GHz.

In an embodiment, a single sequential photon may represent a single pulse of an optical signal, wherein the optical signal may comprise a plurality of sequential photons at different wavelengths. The optical signal may comprise first pulses at a first wavelength and second pulses at a second different wavelength. The apparatus may be arranged to serialize single photon sources by wavelength into the same optical signal. The optical signal may carry information encoded in the sequential photons of the optical signal. The optical signal may comprise first sequential photons at a first wavelength and second sequential photons at a second different wavelength.

In an embodiment, several nanowire detectors may be used together with one or more spectrally selective optical distributors to deserialize the information guided via a single optical fiber. Thus, the total frequency of single photons in the single optical fiber may exceed the bandwidth of a single nanowire detector.

The signal generator apparatus may be used e.g. for providing one or more electric waveforms for a cryogenic quantum data processor. The signal generator apparatus may be used e.g. for scaling up a quantum computer.

The signal generator apparatus may be used e.g. for providing one or more electric waveforms for quantum communication.

In an embodiment, the inverting delay line may also enable driving one or more fast Josephson junctions with, optical-to-electrical converter unit, which comprises a superconducting nanowire single-photon detector (SNSPD). The clipping technique could also enable driving fast Josephson junctions with nanowire detectors (SNSPD) in a quantized arbitrary waveform source.

BRIEF DESCRIPTION OF THE DRAWINGS

In the following examples, several variations will be described in more detail with reference to the appended drawings, in which.

DETAILED DESCRIPTION

Figure 1A:
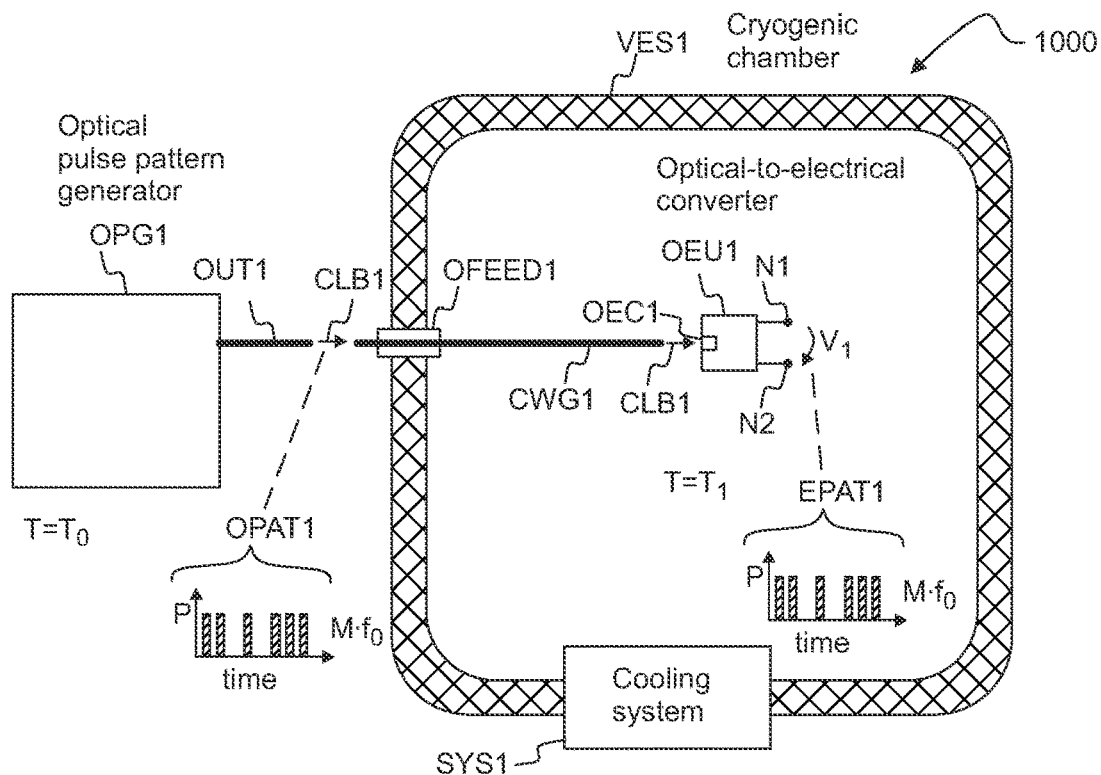
FIG. 1a shows, by way of example, a signal generator apparatus.

Referring to FIG. 1a, the signal generator apparatus 1000 may comprise an optical pattern generator device OPG1 to generate an arbitrary optical pulse pattern OPAT1, an optical feedthrough OFEED1 to guide the optical pulse pattern OPAT1 into a cryogenic chamber VES1, and one or more optical-to-electrical converter units OEU1 to convert the optical pulse pattern OPAT1 into an electric pulse pattern EPAT1 inside the cryogenic chamber VES1. The optical-to-electrical converter unit OEU1 may comprise an optical-to-electrical converter (OEC1). The optical-to-electrical converter (OEC1) may also be called e.g. as a photodetector.

The optical pattern generator device OPG1 may provide an optical signal CLB1, which comprises the optical pulse pattern OPAT1. The optical pulse pattern OPAT1 may also be called e.g. as a sequence of optical pulses.

The optical pulse pattern OPAT1 may comprise a sequence of optical pulses with a maximum pulse repetition frequency $M \cdot f_0$. The maximum pulse repetition frequency $(M \cdot f0)$ of the optical pulse pattern OPAT1 may be high, e.g. higher than 80 GHz, higher than 200 GHz, or even higher than 500 GHz.

The optical signal CLB1 may comprise one or more sequences OPAT1, OPAT2 of optical pulses. One or more sequences OPAT1, OPAT2 of optical pulses of the optical signal CLB1 may be formed e.g. according a primary pattern (e.g. PAT0 in FIG. 11c). The sequence OPAT1 of optical pulses may also be called as an optical pulse pattern OPAT1. The optical signal CLB1 may comprise one or more pulse patterns OPAT1, OPAT2. The pulse repetition rate of the optical pulses of the optical signal CLB1 may be e.g. higher than 40 GHz.

The optical pattern generator device OPG1 may comprise an output (OUT1), which may be coupled to the optical feedthrough OFEED1. The optical signal CLB1 may be guided from the outside of the vessel VES1 to the inside of the vessel VES1 via the optical feedthrough OFEED1. The optical signal CLB1 may be guided from the optical feedthrough OFEED1 to an optical-to-electrical converter unit OEU1 via an optical waveguide CWG1.

The optical-to-electrical converter unit OEU1 may comprise output nodes N1, N2 to provide an electric output signal (V(t)). The electric output signal (V(t)) may comprise the electric pulse pattern EPAT1.

The cryogenic chamber VES1 may comprise a cooling system SYS1 to remove heat from the interior of the cryogenic chamber VES1. The cooling system SYS1 may transfer heat from the inside of the chamber to the outside of the chamber. $T_1$ may denote a cryogenic temperature inside the chamber VES1. $T_0$ may denote an ambient temperature outside the chamber VES1.

The cryogenic temperature $T_1$ may be e.g. lower than 20 K, lower than 5 K, or even lower than 1 K. The cryogenic temperature $T_1$ may be e.g. lower than 5 K. For example, the upper temperature of liquid helium is 4.2 K, and cryogenic temperatures $T_1$ lower than 5 K may be attained by using a cooling system SYS1, which utilizes liquid helium. For more demanding applications, the cooling system SYS1 may be arranged to keep the cryogenic temperature $T_1$ e.g. lower than 1 K. The difference between the ambient temperature $T_0$ and the internal cryogenic temperature $T_1$ may be e.g. greater than 100 K. The ambient temperature $T_0$ may be e.g. substantially equal to the normal room temperature 25° C. (298 K). Different parts may also be cooled to different temperatures. For example, most critical components may be cooled below 1 K, wherein less critical components may be cooled to temperatures, which are in the range of 1 to 5 K.

Each optical-to-electrical converter unit OEU1 may comprise at least one optical-to-electrical converter (OEC1).

The converter OEC1 may be e.g. a uni-traveling-carrier photodiode (UTC-PD). The UTC photodiode may utilize only electrons as the active carriers. The response of a UTC photodiode may have a short rise time. The UTC photodiode may achieve bandwidths of several hundred GHz.

The converter OEC1 may be e.g. a plasmonic photodetector. The plasmonic photodetector may be more energy efficient than a photodiode. The plasmonic photodetector may be easily integrated in a silicon photonic device.

The converter OEC1 may be e.g. a superconducting nanowire single-photon detector (SNSPD). The nanowire detector may have high efficiency. The high efficiency of the nanowire detector may be advantageous e.g. when cooling the cryogenic chamber to temperatures lower than 1 K.

The optical-to-electrical converter OEC1 may be e.g. a superconducting nanowire detector, which may be arranged to detect single and/or multiple photons. The superconducting nanowire detector may be a superconducting nanowire single-photon detector or a structurally modified superconducting nanowire single-photon detector. The structurally modified superconducting nanowire single-photon detector may have suitable detection efficiency for detecting multiple photons.

The apparatus 1000 may comprise one or more optical feedthroughs OFEED1 for guiding one or more optical signals into the cryogenic chamber VES1.

Figure 1B:
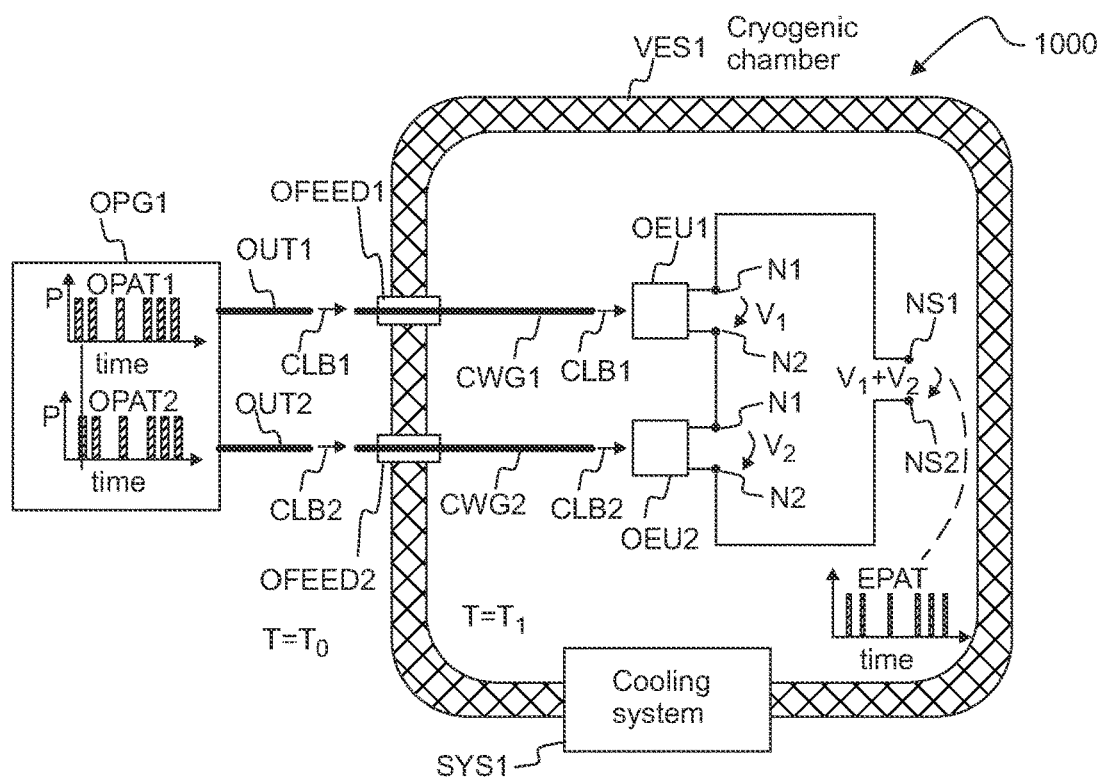
FIG. 1b shows, by way of example, a signal generator apparatus.

Referring to FIG. 1*b*, the apparatus 1000 may comprise two or more optical-to-electrical converter units OEU1, OEU2 connected in series. The combination of the optical-to-electrical converter units OEU1, OEU2 may have output nodes NS1, NS2. The output nodes NS1, NS2 may provide e.g. the sum $(V_1(t)+V_2(t))$ or the difference $(V_1(t)-V_2(t))$ of the output voltages $V_1(t)$, $V_2(t)$ of the optical-to-electrical converter units OEC1, OEC2. Two or more converter units OEC1, OEC2 may be connected in series to increase signal level and/or to increase dynamic range.

Two or more converter units OEU1, OEU2 may be connected in series such that the polarity of a second converter unit OEU2 may be opposite to the polarity of a first converter unit OEU2. Consequently, the output nodes NS1, NS2 may provide the difference $(V1(t)-V2(t))$ between the output voltages $V1(t)$, $V2(t)$ of the converter units OEU1, OEU2. The converter units OEU1, OEU2 may be connected in series with opposite polarities e.g. in order to provide positive and negative electric pulses, and/or in order to shorten temporal width of electric pulses.

The optical pattern generator device OPG1 may provide a first optical pattern OPAT1 and a second optical pattern OPAT2. The second optical pattern OPAT2 may be synchronized with the first optical pattern OPAT1. The first optical pattern OPAT1 may be guided to a first converter unit OEU1, and the second optical pattern OPAT2 may be guided to a second converter unit OEU2. The first converter unit OEU1 may form a first output voltage $V_1(t)$ by converting the first optical pattern OPAT1 into electrical pulses. The second converter unit OEU2 may form a second independently controllable output voltage $V_2(t)$ by converting the second optical pattern OPAT2 into electrical pulses. The output voltages $V_1(t)$, $V_2(t)$ may be combined to form a combined output. For example, the converter units OEU1, OEU2 may be connected in series to provide an electric pattern EPAT, which is formed as the sum $(V1(t)+V2(t))$ of the output voltages $V1(t)$, $V2(t)$ of the converter units OEU1, OEU2. For example, the converter units OEU1, OEU2 may be connected in series to provide an electric pattern EPAT, which is formed as the difference $(V1(t)-V2(t))$ between the output voltages $V1(t)$, $V2(t)$ of the converter units OEC1, OEC2.

In an embodiment, a first optical signal CLB1 may comprise the first optical pattern OPAT1, and a second optical signal CLB2 may comprise the second optical pattern OPAT2. The first optical signal CLB1 may be guided from the optical pattern generator device OPG1 to the first converter unit OEU1 via a first optical feedthrough OFEED1 and via a first waveguide CWG1. The second optical signal CLB2 may be guided from the optical pattern generator device OPG1 to the second converter unit OEU2 via a second optical feedthrough OFEED2 and via a second waveguide CWG2.

In an embodiment, several optical patterns OPAT1, OPAT2 may be carried by the same optical signal CLB1 e.g. by wavelength multiplexing. The wavelength multiplexing may e.g. provide high degree of mutual synchronization between the optical patterns OPAT1, OPAT2.

The wavelength multiplexing may also allow guiding several optical patterns OPAT1, OPAT2 into the cryogenic chamber VES1 via the same optical feedthrough, e.g. in order to avoid thermal power conducted via the second feedthrough OFEED2.

In an embodiment, the timing of the pulses of the pattern OPAT2 with respect to the timing of the pulses of the pattern OPAT1 may be selected so as to shorten the temporal width of the electric pulses of the electric pulse pattern EPAT1.

Figures 2A, 2B:
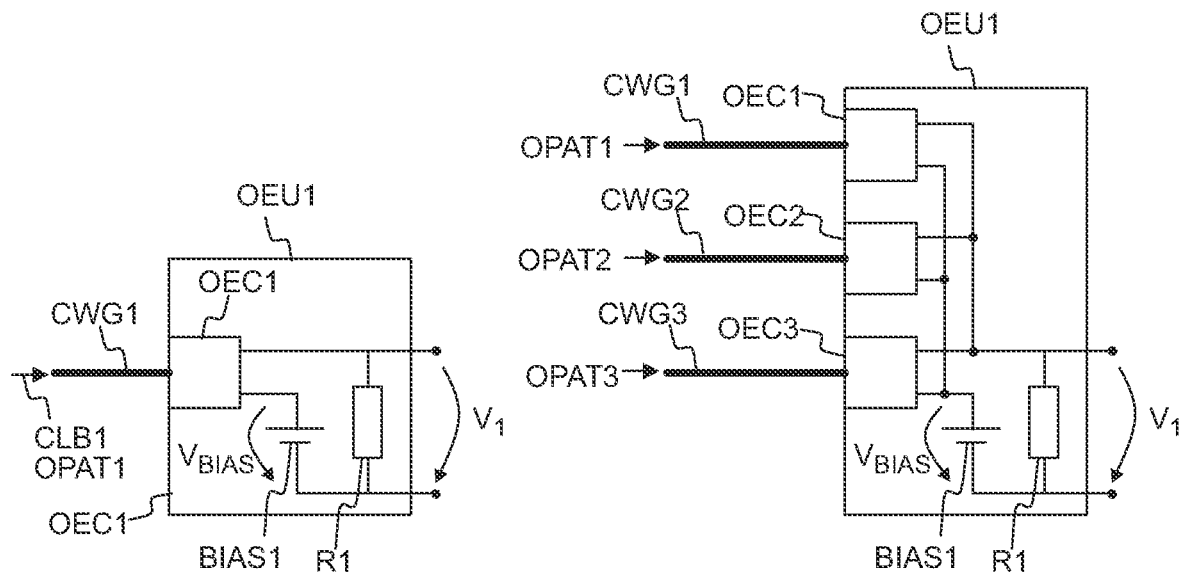
FIG. 2a shows, by way of example, a converter unit.
FIG. 2b shows, by way of example, a converter unit.

Referring to FIG. 2*a*, an optical-to-electrical converter unit OEU1 may comprise a bias voltage supply BIAS1 to provide a bias voltage $V_{BIAS1}$ for an optical-to-electrical converter OEC1. The optical-to-electrical converter OEC1 may be e.g. a plasmonic photodetector. The optical-to-electrical converter unit OEU1 may optionally comprise a resistor R1 e.g. for impedance matching. A waveguide or a waveguide portion CWG1 may guide an optical pulse pattern OPAT1 to the optical-to-electrical converter OEC1 of the unit OEU1.

Referring to FIG. 2*b*, the output nodes of several optical-to-electrical converters OEC1, OEC2, OEC3 may be connected in parallel to provide a single output $V_1$. The converters OEC1, OEC2, OEC3 may be biased by a single bias voltage supply BIAS1. The converters OEC1, OEC2, OEC3 may be e.g. a plasmonic photodetectors. Optical pulse patterns OPAT1, OPAT2, OPAT3 may be guided to the converters OEC1, OEC2, OEC3 via separate waveguides CWG1, CWG2, CWG3.

Figure 2C:
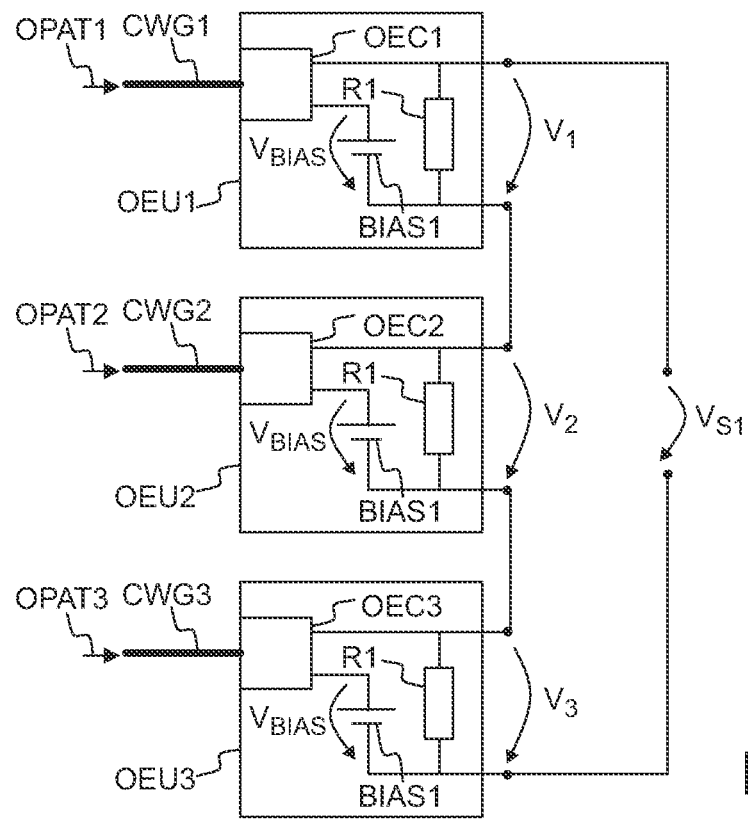
FIG. 2c shows, by way of example, several converter units connected in series.

Referring to FIG. 2c, several optical-to-electrical converter units OEU1, OEU2, OEU3 may be connected in series to form a combined output $V_{S1}$ from the outputs $V_1$, $V_2$, $V_3$ of the converter units OEU1, OEU2, OEU3.

Figure 3A:
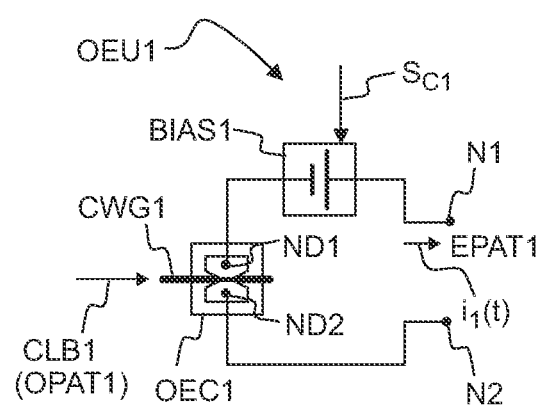
FIG. 3a shows, by way of example, a converter unit, which comprises a plasmonic photodetector.

Referring to FIG. 3a, each optical-to-electrical converter unit OEU1 may comprise one or more optical-to-electrical converters OEC1. The optical-to-electrical converter OEC1 may be e.g. a plasmonic photodetector.

The optical-to-electrical converter unit OEU1 may comprise a bias voltage unit BIAS1 to provide a bias voltage for the optical-to-electrical converter OEC1. The bias unit BIAS1 may provide a bias voltage for a plasmonic photodetector. The bias unit BIAS1 may be connected in series with connection nodes ND1, ND2 of the optical-to-electrical converter OEC1.

Operation of the optical-to-electrical converter unit OEU1 may be controlled e.g. by a control signal Sci.

An optical pulse may temporarily increase conductivity between the nodes ND1, ND2 so that the converter unit OEU1 may generate a driving current pulse $i_1(t)$. The optical-to-electrical converter unit OEU1 may convert a sequence of optical pulses OPAT1 into a sequence of driving current pulses EPAT1.

Each optical-to-electrical converter OEC1, OEC2 may be optionally implemented on an optical waveguide CWG1, CWG2. the optical waveguides (CWG1, CWG2) may be e.g. silicon waveguides.

Figure 3B:
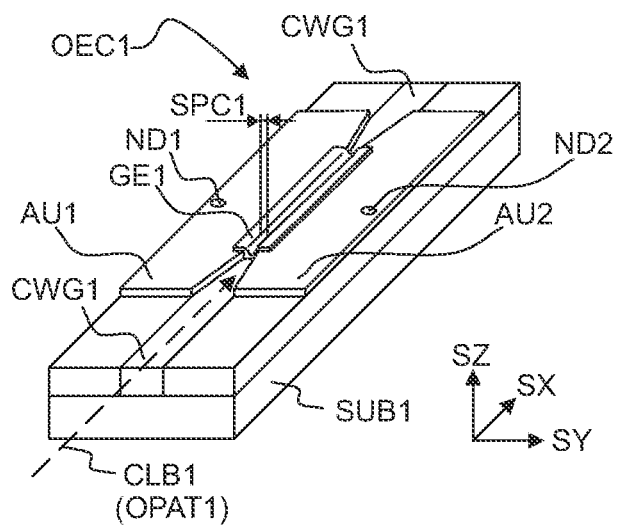
FIG. 3b shows, by way of example, in a three-dimensional view, a plasmonic photodetector implemented on a waveguide.

FIG. 3b shows, by way of example, a plasmonic photodetector OEC1 implemented on an optical waveguide CWG1. The plasmonic photodetector OEC1 may comprise metallic structures AU1, AU2 to define a plasmonic gap SPC1. The plasmonic gap SPC1 may be at least partly filled with semiconducting material GE1, e.g. germanium. Light of an optical signal CLB1 may be coupled from the waveguide CWG1 to the plasmonic gap SPC1 by evanescent coupling, so as to effectively interact with the semiconducting material GE1. The metallic structures AU1, AU2 may comprise or consist of e.g. gold. The metallic structures AU1, AU2 may be arranged to operate as output nodes ND1, ND2 of the plasmonic photodetector OEC1. The waveguide CWG1 may be implemented on a substrate SUB1. The waveguide CWG1 may be e.g. silicon waveguide implemented on a substrate SUB1.

A plasmonic photodetector (OEC1) may comprise one or more metallic structures to confine light by coupling an electromagnetic wave to charged carrier oscillations at a surface of the metal. The wavelength of the oscillations may be smaller than the corresponding wavelength in vacuum. The resulting interaction between light and matter in the subwavelength scale may allow providing a compact high-speed photodetector.

Figure 4A:
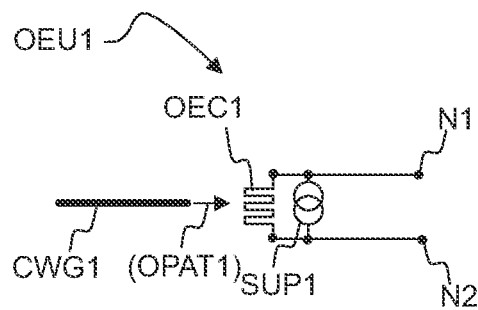
FIG. 4a shows, by way of example, a converter unit which comprises a nanowire detector.

Referring to FIG. 4a, a converter unit OEU1 may comprise an optical-to-electrical converter OEC1, and a bias current supply SUP1. The optical-to-electrical converter OEC1 may be a superconducting nanowire single-photon detector (SNSPD). The bias current supply SUP1 may be arranged to provide a bias current for the nanowire detector OEC1.

Figure 4B:
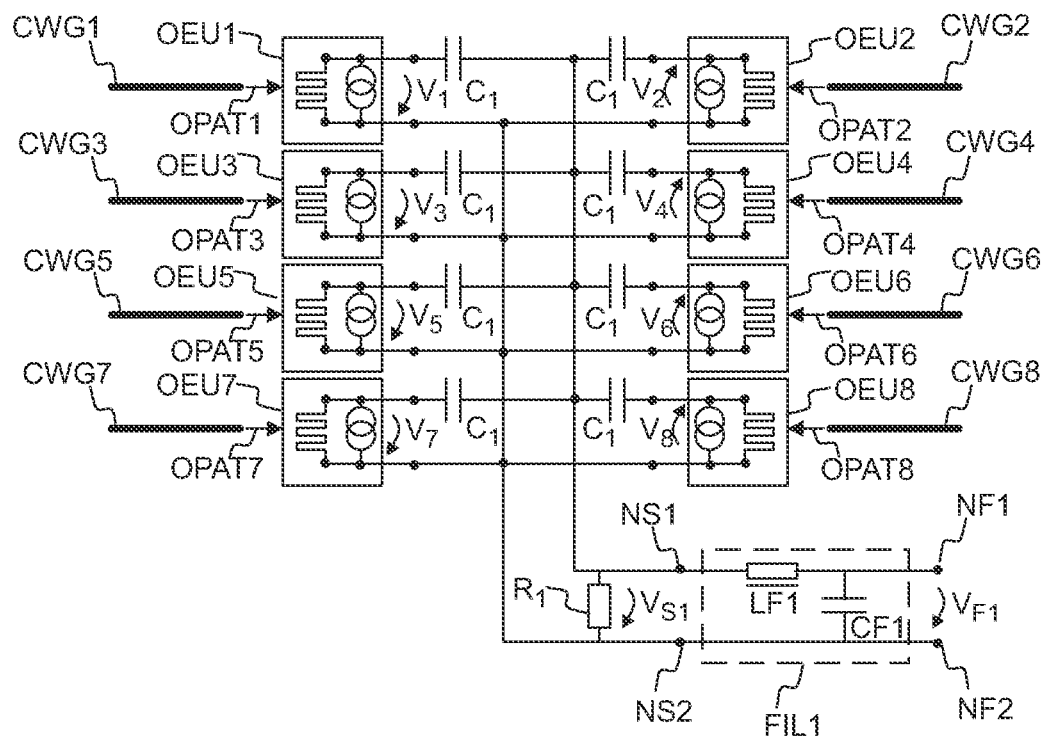
FIG. 4b shows, by way of example, several converter units, which are connected in parallel.

Referring to FIG. 4b, the outputs $V_1, V_2, \ldots V_8$ of several converter units may be combined to form a combined output signal $V_{S1}$. For example, the outputs may be capacitively connected in parallel to form a combined output signal $V_{S1}$. The outputs of one or more converter units may be optionally inverted e.g. in order to provide shortened pulses and/or in order to provide a negative electric pulses (in addition to positive pulses).

The apparatus 1000 may optionally comprise a resistor $R_1$ for impedance matching. The outputs of the converter units may be e.g. capacitively connected to the resistor $R_1$ for impedance matching.

The output signal $V_{S1}$ may be optionally filtered with a low pass filter FIL1 to provide a filtered output signal $V_{F1}$. The low pass filter FIL1 may be implemented e.g. by one or more inductive elements $L_{F1}$ and by one or more capacitive elements $C_{F1}$.

Figure 5:
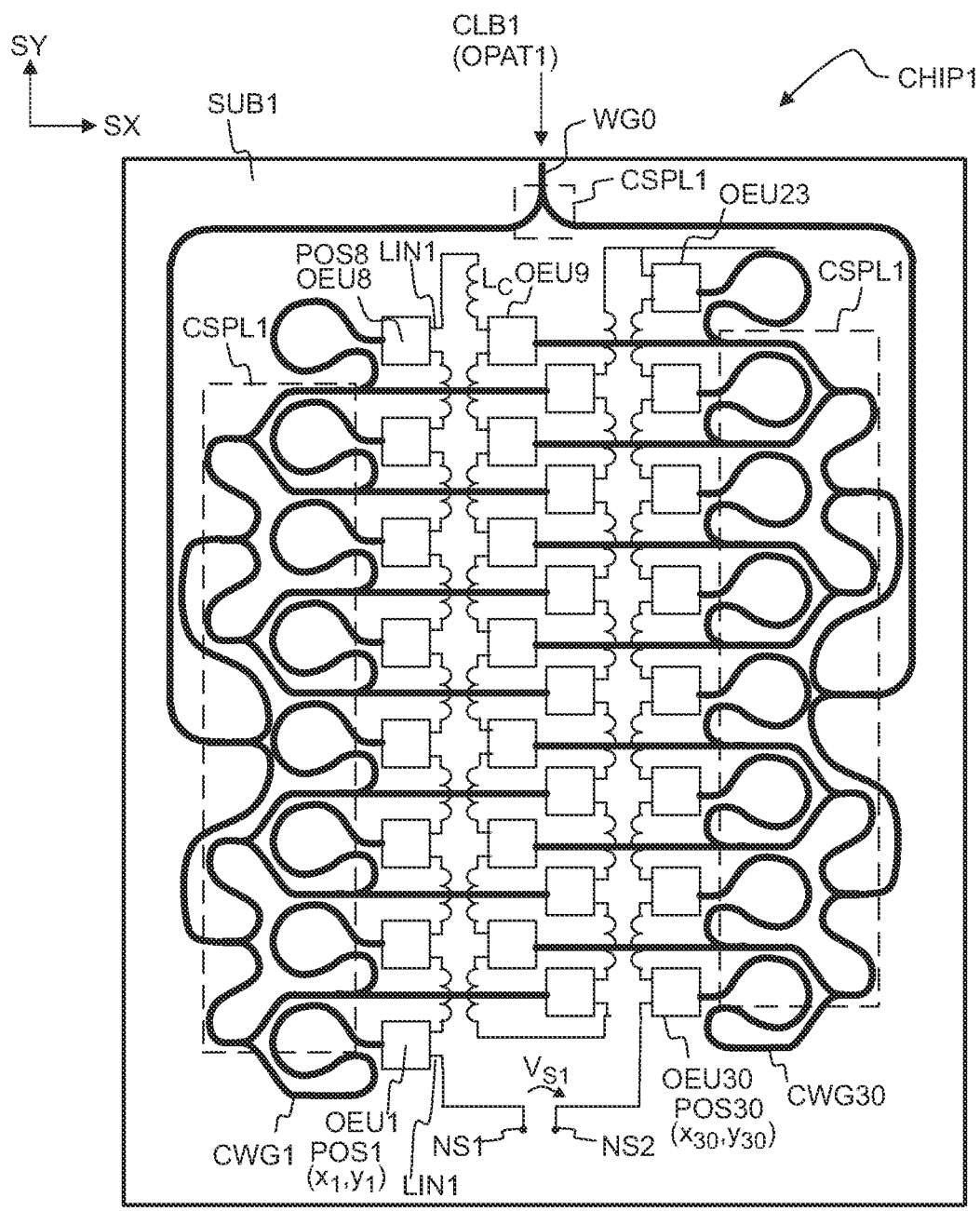
FIG. 5 shows, by way of example, several converter units implemented on a substrate.

Referring to FIG. 5, a plurality of waveguides CWG1, CWG2 and a plurality of converter units OEU1, OEU2 may be implemented on the same substrate SUB1. One or more optical pulse patterns OPAT1 of the optical signal CLB1, may be distributed via one or more optical distributors CSPL1 and via the plurality of waveguides CWG1 to the converter units OEU1, OEU2. The optical distribution of the one or more optical pulse patterns OPAT1 may allow selecting the spatial positions POS1 of the converter units OEU1, OEU2 such that the length of the electric transmission lines LIN1 may be reduced or minimized. Consequently, distributing the optical pulse patterns OPAT1 via the several waveguides may allow high bandwidth for the converted electrical pulses. The position of each converter unit may be specified e.g. by coordinates (x,y). SX, SY and SZ may denote orthogonal directions.

The apparatus 1000 may comprise an integrated module CHIP1, which comprises a plurality of optical-to-electrical converters and a plurality of waveguides for distributing one or more optical pulse patterns to the optical-to-electrical converters.

Two or more converter units may be optionally connected in series via inductive components ($L_C$).

Figure 6A:
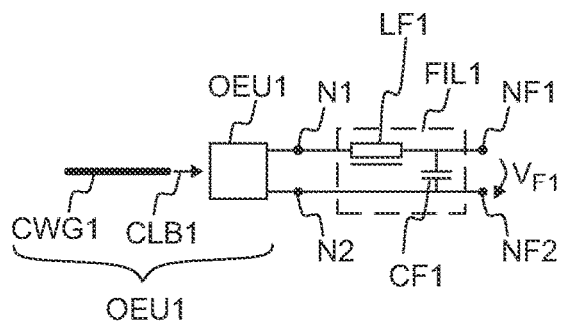
FIG. 6a shows, by way of example, a converter unit and a low pass filter.
Figure 6B:
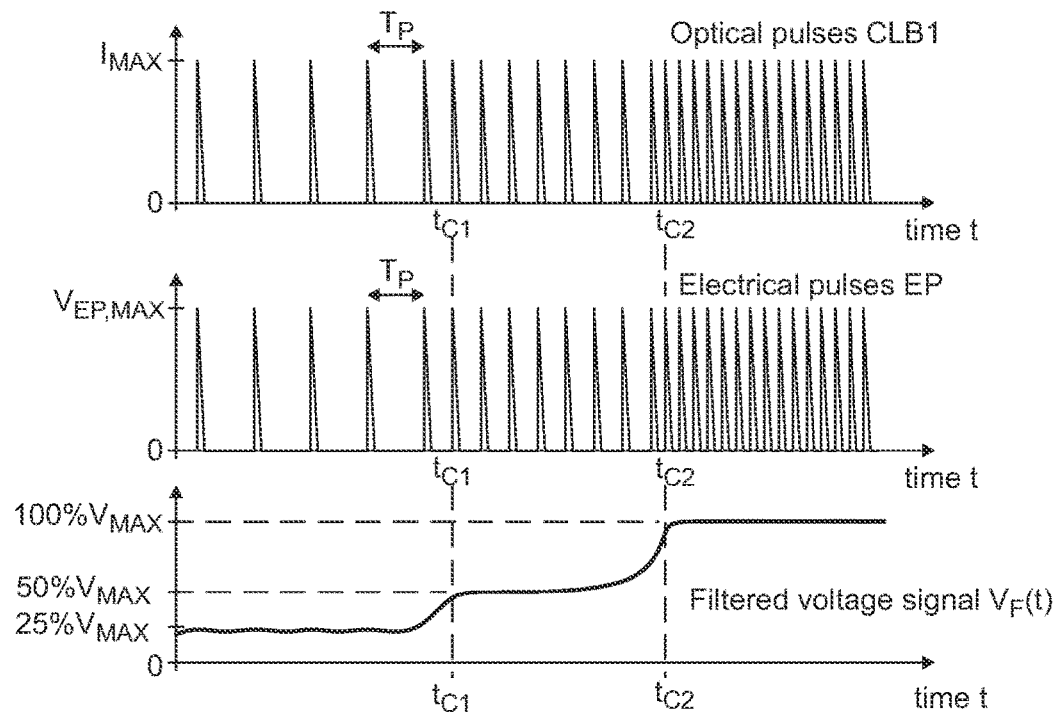
FIG. 6b shows, by way of example, conversion of optical pulse frequency into voltage.

Referring to FIGS. 6a and 6b, the output nodes N1, N2 of one or more optical-to-electrical converter units OEU1 may be connected to an electric low pass filter.

The electrical pulse pattern EPAT1 of a converter unit OEU1 may be low-pass filtered to provide a filtered output $V_{F1}(t)$. The instantaneous voltage level $V_{F1}(t)$ of the filtered output may be proportional to the frequency (f(t)) of the existing optical pulses (logical level one). Thus, the instantaneous voltage level of the filtered output may be controlled by selecting the frequency (f(t)) of the existing optical pulses (logical level one). The signal generator apparatus 1000 may comprise one or more optical-to-electrical converter units OEU1 and one or more low pass filters FIL1 to generate an electric waveform $V_{F1}(t)$ from electric pulses by delta-sigma conversion at a cryogenic temperature ($T_1$). The cut-off frequency of the low-pass filter FIL1 may be smaller than the maximum frequency ($M \cdot f_0$) of the electrical pulses. The low-pass filter may eliminate ultrafast signal components and may ensure that the voltage level of the output signal is proportional to the frequency of those optical pulses, which represent the logical signal level one.

Figure 6C:
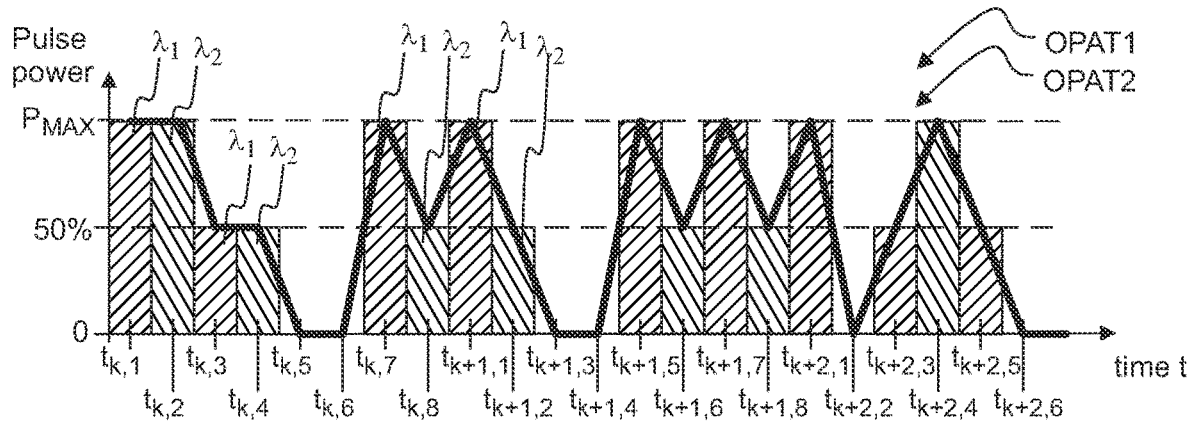
FIG. 6c shows, by way of example, a multi-level optical signal.

Referring to FIG. 6c, the modulators (MOD1, MOD2, MOD3, MOD4) of the optical pattern generator device OPG1 may also be arranged to provide other levels than the existing pulse (logical level one) and the missing pulse (logical level zero). For example, each modulator may have three or more states to provide one or more intermediate signal levels in addition to the zero level (0) and the full level (1). For example, each modulator may be arranged to provide a half level optical pulse (50%) in addition to the missing (blocked) pulse and the full level pulse (100%).

The optical pattern generator device OPG1 may also be arranged to provide an optical signal CLB1, which comprises two or more optical pulse patterns OPAT1, OPAT2 at different wavelengths $\lambda_1$, $\lambda_2$. The optical pulse patterns OPAT1, OPAT2 may also be interlaced so as to provide a substantially continuous envelope for the optical waveform.

The optical pulse patterns OPAT1, OPAT2 of FIG. 6c may also be guided to the same optical-to-electrical converter OEC1, in order to provide an arbitrary electric waveform, which corresponds to the combination of the optical pulse patterns OPAT1, OPAT2. Thus, the apparatus 1000 may provide an arbitrary electric waveform, which may have a substantially continuous envelope also without using a low pass filter.

Figure 7A:
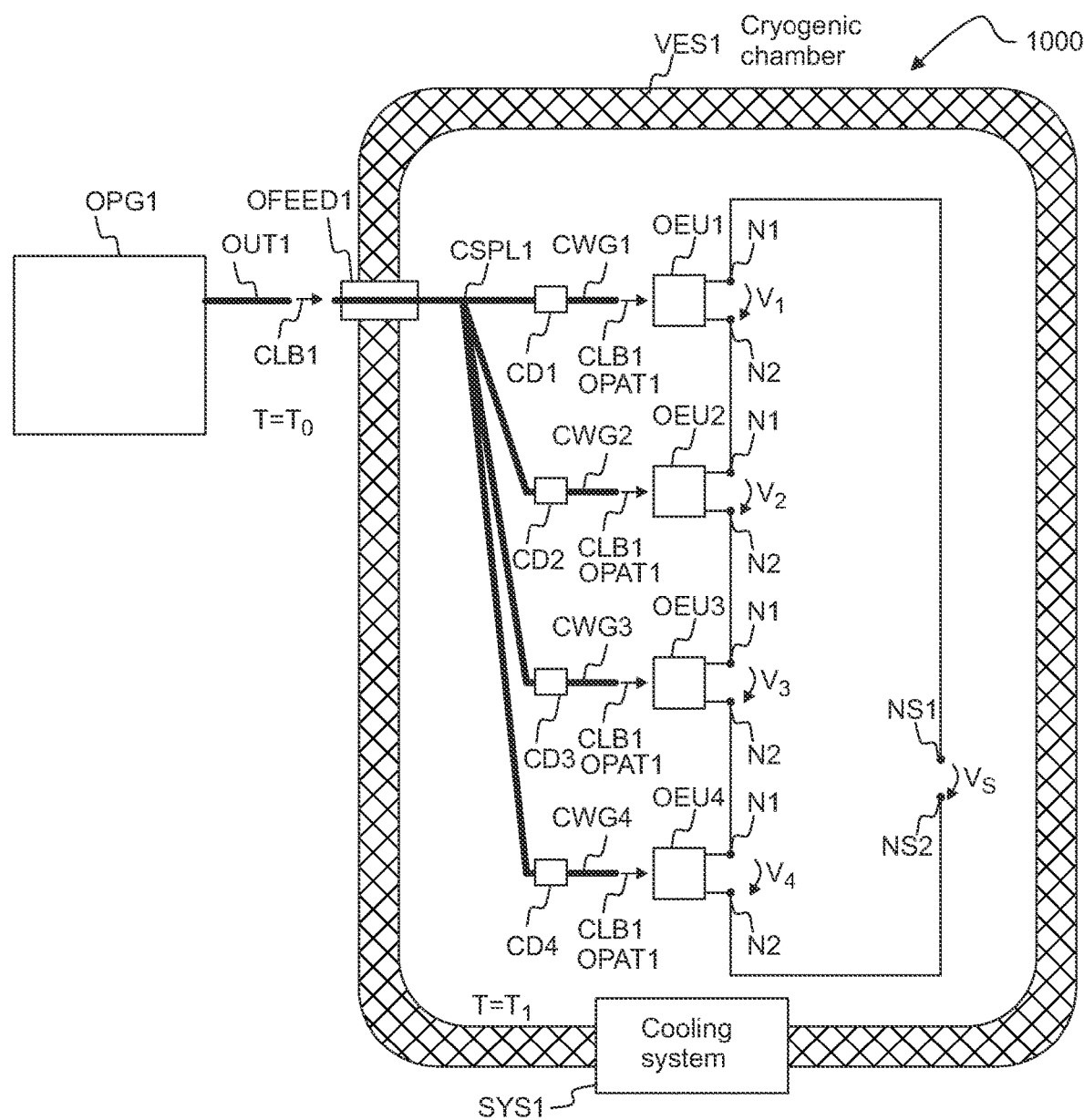
FIG. 7a shows, by way of example, a pattern generating apparatus, which comprises several converter units driven by the same optical pulse sequence.

Referring to FIG. 7a, the apparatus 1000 may comprise two or more converter units OEU1, OEU2 connected in series, e.g. in order to increase magnitude of the electric output signal. An optical input signal CLB1 may be distributed to several converter units OEU1, OEU2, OEU3, OEU4 by one or more distributors CSPL1 and by optical waveguides CWG1, CWG2, CWG3, CWG4. The arrival times of the distributed signals CLB1 at the optical-to-electrical converters may be optionally tailored and/or synchronized by using delay lines CD1, CD2, CD3, CD4. Each delay line CD1, CD2, CD3, CD4 may provide a propagation delay. The propagation delay of each delay line CD1, CD2, CD3, CD4 may be selected e.g. such that optical pulses arrive simultaneously at the optical-to-electrical converters of the units OEU1, OEU2, OEU3, OEU4.

The combination of the converter units OEU1, OEU2, OEU3, OEU4 may provide a combined electric output signal $V_S(t)$ from the output nodes NS1, NS2 of said combination.

Figure 7B:
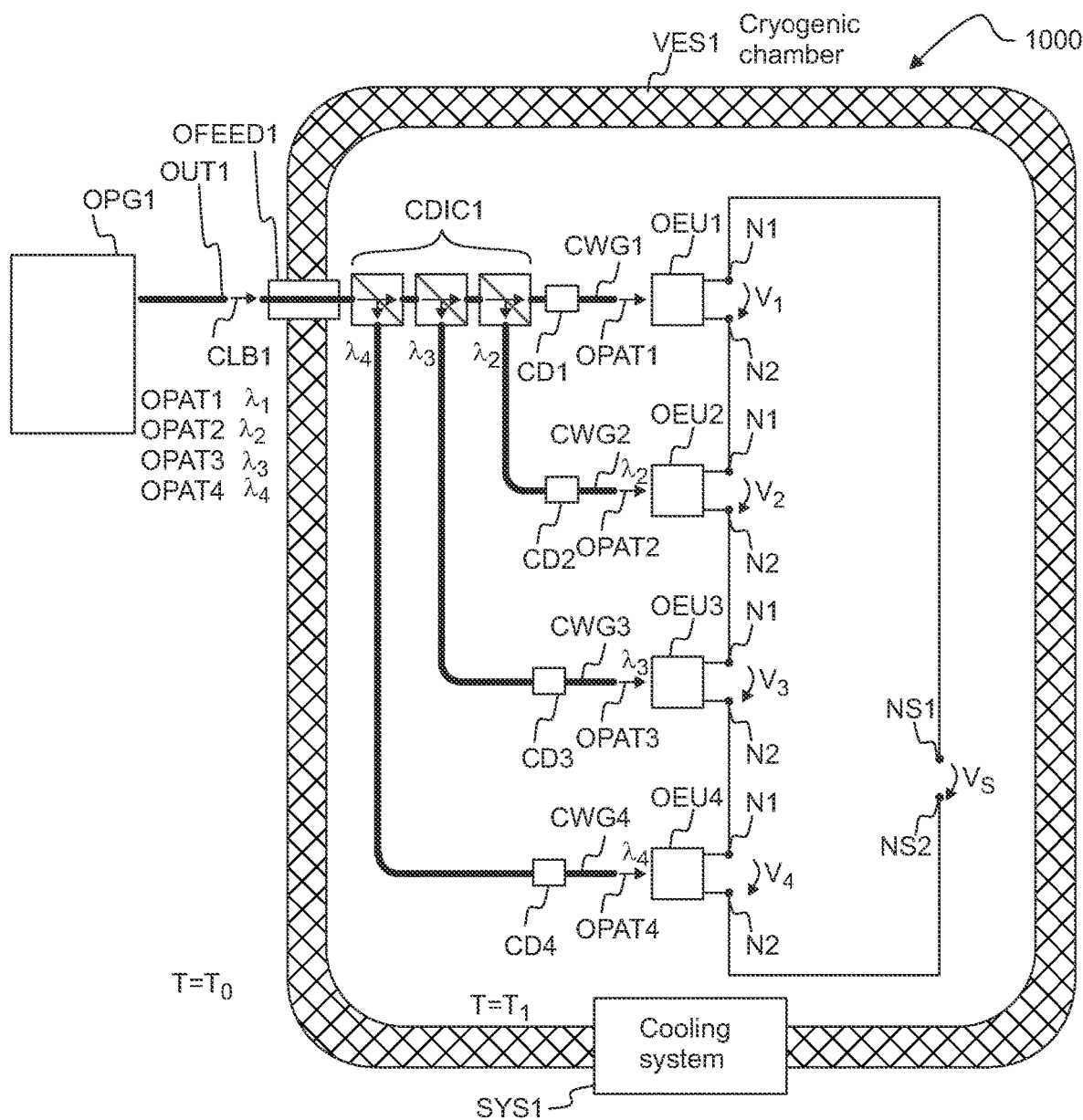
FIG. 7b shows, by way of example, a signal generator apparatus, which comprises several converter units driven by different optical pulse sequences.

Referring to FIG. 7b, the apparatus 1000 may comprise two or more converter units OEU1, OEU2 connected in series, e.g. in order to provide an increased dynamic range. An optical signal CLB1 may comprise several individually selectable optical pulse patterns at different wavelengths $\lambda_1$, $\lambda_2$, $\lambda_3$, $\lambda_4$. The different spectral components of the optical signal CLB1 may be separated by using one or more spectrally selective distributors CDIC1. The separated spectral components may be guided to different converter units OEU1, OEU2, OEU3, OEU4, e.g. to allow changing the amplitude and/or repetition rate of the electric pulses provided by a first converter unit OEU1, when compared with the amplitude and/or repetition rate of the electric pulses provided by a second converter unit OEU2. The separated spectral components may be guided to different converter units OEU1, OEU2, OEU3, OEU4 so as to provide several individually selectable arbitrary electric waveforms ($V_1(t)$, $V_2(t)$, $V_3(t)$, $V_4(t)$). The converter units OEU1, OEU2, OEU3, OEU4 may be connected in series in order to provide a sum of the waveforms ($V_1(t)$, $V_2(t)$, $V_3(t)$, $V_4(t)$).

The propagation delay of each delay line CD1, CD2, CD3, CD4 may be selected e.g. such that optical pulses arrive simultaneously at the optical-to-electrical converters of the units OEU1, OEU2, OEU3, OEU4.

Figure 9A:
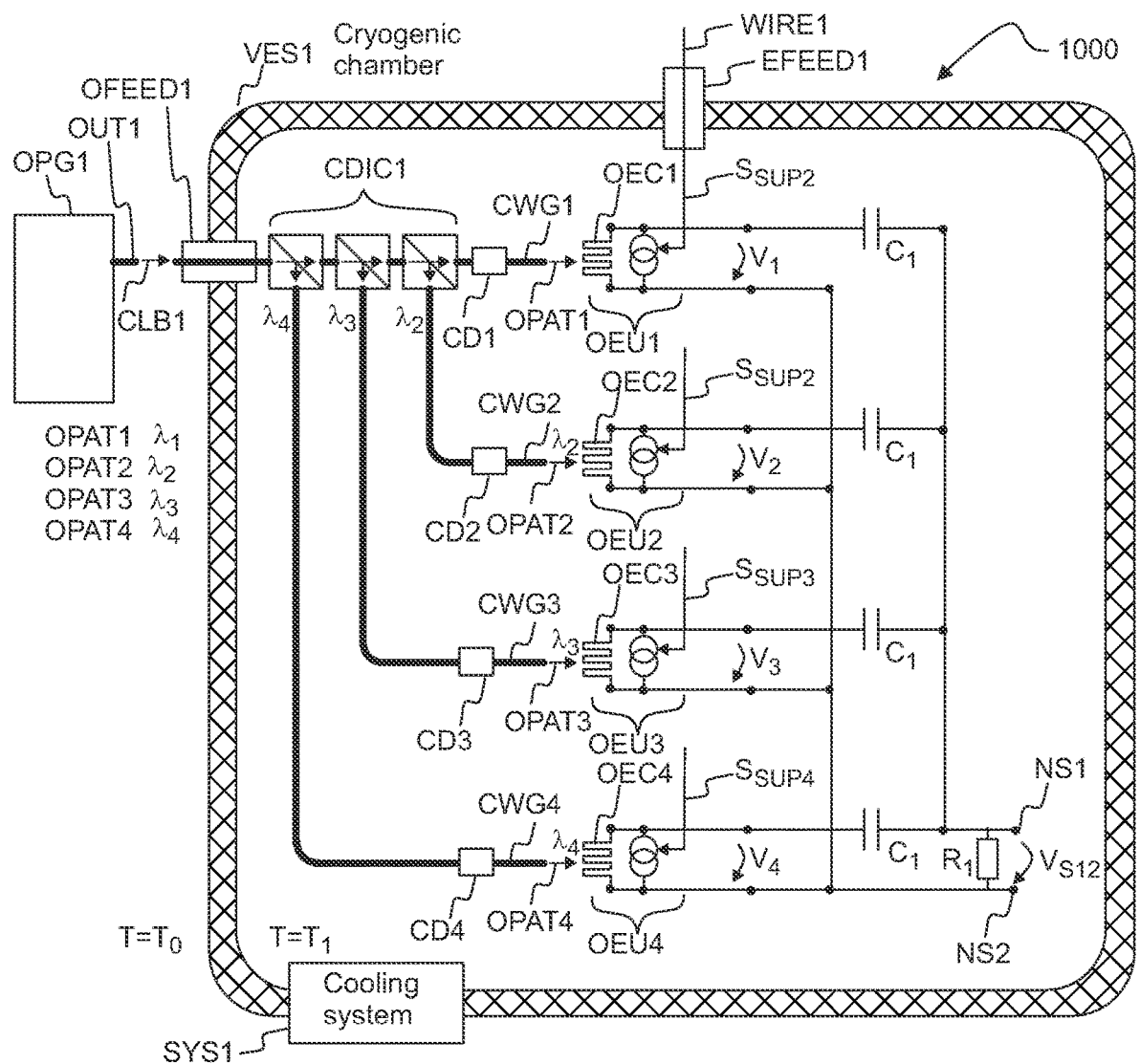
FIG. 9a shows, by way of example, a signal generator apparatus, which comprises several converters driven with different optical pulse patterns at different wavelengths.

Alternatively, the propagation delay of each delay line CD1, CD2, CD3, CD4 may also be selected such that arrival times of optical pulses at the optical-to-electrical converters are interlaced. Interlaced arrival times may be used e.g. when guiding wavelength-demultiplexed optical pulses to several nanowire detectors OEC1, OEC2, OEC3 OEC4 (FIG. 9a). Consequently, the (total) modulation frequency of the optical signal CLB1 may exceed the cut-off frequency of the response of an individual detector (OEC1). If the combined (sum) output of the converter units OEU1, OEU2, OEU3, OEU4 is filtered with a low-pass filter FIL1, then the interlaced arrival times may allow selecting the cut-off frequency of the low-pass filter to be higher than the cut-off frequency of the response of said individual detector (OEC1).

Referring to FIGS. 8a to 8d, a converter unit OEU1 may comprise an optical-to-electrical converter OEC1, a bias current supply SUP1, and an inverting electric delay line ED1.

Figure 8A:
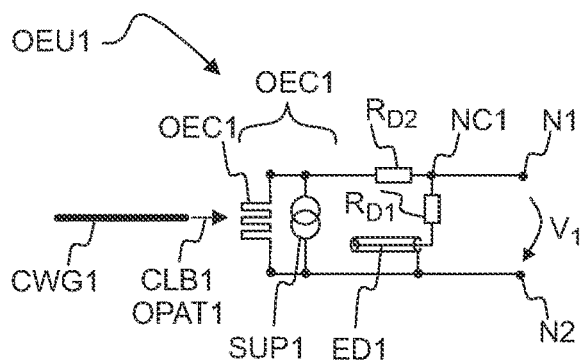
FIG. 8a shows, by way of example, a circuit for shortening electrical pulses with an inverting delay line.
Figure 8B:
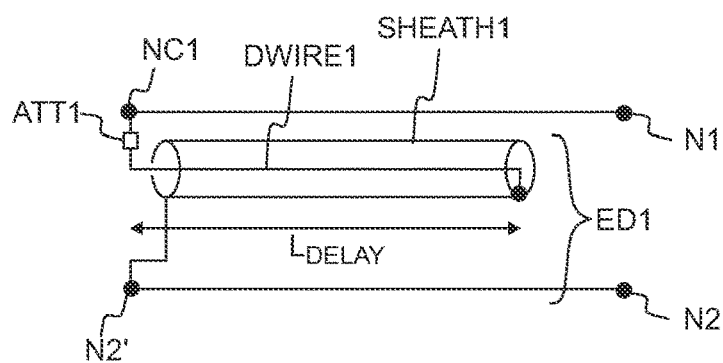
FIG. 8b shows, by way of example, an inverting delay line.

The optical-to-electrical converter OEC1 may be a superconducting nanowire single-photon detector (SNSPD). The response of the nanowire detector OEC1 may have a long tail (FIGS. 8c and 8d)

The bias current supply SUP1 may be arranged to provide a bias current for the nanowire detector OEC1. The inverting electric delay line ED1 may receive a voltage pulse from an output node NC1, the delay line ED1 may form an inverted delayed signal from the voltage pulse, and the inverting electric delay line ED1 may add the inverted delayed signal to the original voltage pulse at the output node NC1. Consequently, the output node NC1 may provide a shortened electric voltage pulse (FIGS. 8c and 8d).

Figure 7C:
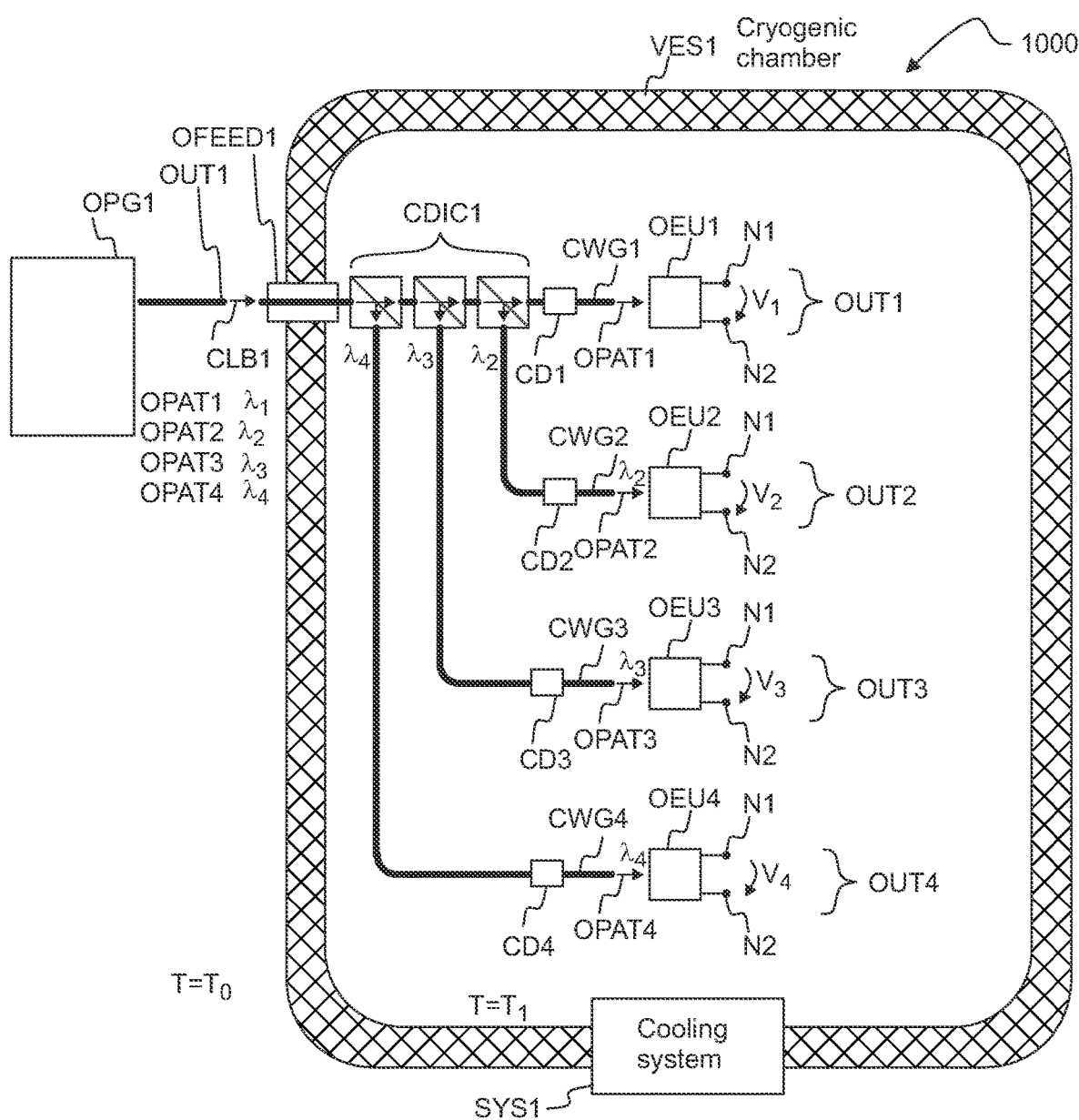
FIG. 7c shows, by way of example, a signal generator apparatus, which comprises several outputs.

In an embodiment, the apparatus 1000 may comprise several optical-to-electrical converter units OEU1, OEU2, OEU3, OEU4 to provide electrical pulses $V_1$, $V_2$, $V_3$, $V_4$ from several different independently controllable outputs OUT1, OUT2, OUT3, OUT4 (FIG. 7c). Optical pulse patterns OPAT1, OPAT2, OPAT3, OPAT4 of an optical signal CLB1 may be wavelength-selectively distributed via waveguides CWG1, CWG2, CWG3, CWG4 to the different optical-to-electrical converter units OEU1, OEU2, OEU3, OEU4.

Figure 8C:
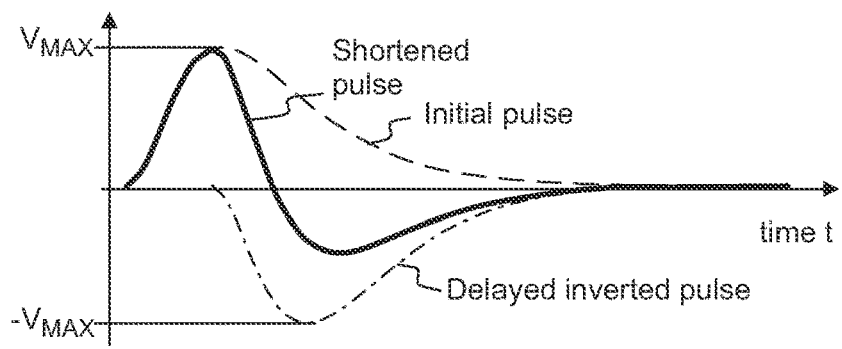
FIG. 8c shows, by way of example, forming a shortened pulse by adding an inverted delayed signal.
Figure 8D:
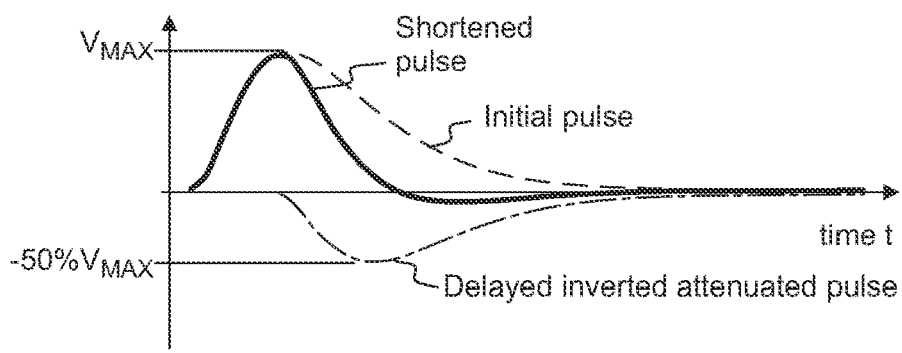
FIG. 8d shows, by way of example, forming a shortened pulse by adding an inverted delayed attenuated signal.

FIG. 8c shows a situation where the amplitude of the inverted delayed pulse is equal to the amplitude of the original voltage pulse.

FIG. 8c shows a situation where the amplitude of the inverted attenuated delayed pulse is equal to 50% of the amplitude of the original voltage pulse.

Referring to FIG. 8b, the delay line ED1 may be implemented e.g. by a superconducting wire DWIRE1, which may be surrounded by a coaxial sheath SHEATH1 in order to reduce electromagnetic radiation losses. The first end of the wire may be connected to the node NC1. The second end of the wire may be short-circuited by connecting the second end to a local ground node (N2'), so as to reflect and invert the voltage pulse which propagates along the delay line.

The delay line ED1 may optionally comprise an attenuating element ATT1 to reduce the amplitude of the inverted delayed pulse. The delay time provided by the delay line ED1 may be selected by selecting the length $L_{DELAY}$ of the wire DWIRE1.

The delayed inverted pulse may be added to the original pulse e.g. by using resistive coupling, by using inductive coupling, by using capacitive coupling, or a combination thereof. The delayed inverted pulse may be added to the original pulse e.g. by using resistors $R_{D1}$, $R_{D2}$.

Referring to FIG. 9a, several optical-to-electrical converter units OEU1, OEU2, OEU3, OEU4 may be connected capacitively in parallel. Spectral components of an optical signal CLB1 may be separated by spectrally selective distributor CDIC1, and the spectral components at the different wavelengths $\lambda_1$, $\lambda_2$, $\lambda_3$, $\lambda_4$ may be guided to different converter units OEU1, OEU2, OEU3, OEU4. Consequently, each converter unit OEU1, OEU2, OEU3, OEU4 may provide an individually selectable electric pulse pattern. The converter units OEU1, OEU2, OEU3, OEU4 may be arranged to form a combined signal $V_{S1}$ by combining the output voltages $V_1(t)$, $V_2(t)$, $V_3(t)$, $V_4(t)$ of the converter units OEU1, OEU2, OEU3, OEU4.

In an embodiment, the maximum pulse repetition rate of the combined signal $V_{S1}$ may be higher than the maximum frequency determined by the response of an individual optical-to-electrical converter unit OEU1. In particular, each optical-to-electrical converter unit may comprise a nanowire detector (OEC1, OEC2, OEC3, OEC4).

The output pulses $V_1(t)$, $V_2(t)$, $V_3(t)$, $V_4(t)$ of the converter units OEU1, OEU2, OEU3, OEU4 may be optionally shortened e.g. by using the inverting delay lines ED1.

Converting the spectral components at the different wavelengths $\lambda_1$, $\lambda_2$, $\lambda_3$, $\lambda_4$ into the electrical pulse patterns by the different converter units OEU1, OEU2, OEU3, OEU4 may allow de-serializing of optical pulses of an optical signal CLB1.

In an embodiment, a single photon pulse or a multi-photon pulse may represent a single pulse of an optical signal, wherein the optical signal CLB1 may comprise a plurality of sequential photons at different wavelengths $\lambda_1$, $\lambda_2$, $\lambda_3$, $\lambda_4$. The optical signal may comprise first pulses at a first wavelength and second pulses at a second different wavelength. The apparatus 1000 may be arranged to serialize single photon sources by wavelength into the same optical signal CLB1. The optical signal CLB1 may carry information encoded in the sequential photons of the optical signal. The optical signal CLB1 may comprise first sequential photons at a first wavelength $\lambda_1$, and second sequential photons at a second different wavelength $\lambda_2$. Nanowire detectors may be used together with one or more spectrally selective optical distributors CDIC1 to deserialize the information guided via a single optical fiber. Thus, the total frequency of single photons in the single optical fiber may exceed the bandwidth of a single nanowire detector (OEC1).

In an embodiment, the operation of one or more converter units OEU1, OUE2 may be enabled and disabled by a control signal. For example, operation of the converter unit OEU1 may be enabled and disabled by communicating a control signal $S_{SUP1}$ to the bias supply SUP1 of the nanowire detector OEC1.

The operation of one or more optical-to-electrical converters may be controlled by one or more control signals ($S_{SUP1}$, $S_{SUP2}$, $S_{SUP3}$, $S_{SUP4}$), e.g. in order to increase dynamic range.

The control signals may be communicated e.g. via one or more control signal lines WIRE1. The control signals may be communicated to the chamber VES1 e.g. via one or more feedthroughs EFEED1.

In an embodiment the bias current or voltage of a first optical-to-electrical converter (OEC1) may be different from the bias current or voltage of a second optical-to-electrical converter (OEC2), e.g. in order to provide an increased dynamic range. The relative magnitude of the bias may be selected e.g. such that the ratio of the bias of a converter identified by an index k is substantially equal to the bias of a first converter multiplied by $2^{k-1}$.

In an embodiment, the method may comprise changing the bias voltage or bias current of the optical-to-electrical, so as to change the amplitude of the produced electrical pulses.

Figure 9B:
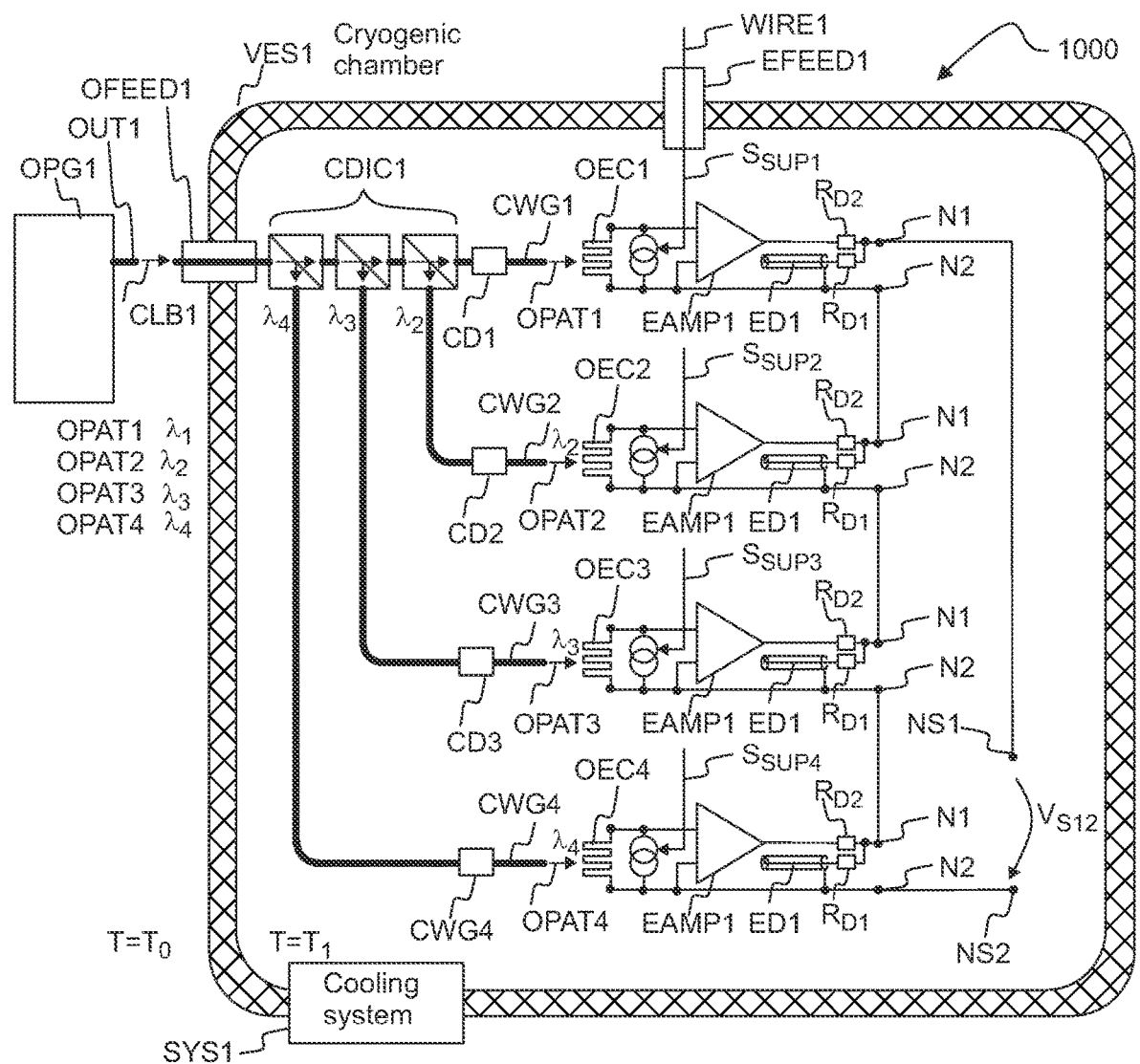
FIG. 9b shows, by way of example, a signal generator apparatus, which comprises several converters driven with different optical pulse patterns at different wavelengths.

Referring to FIG. 9b, the electric signals of the optical-to-electrical converters may be optionally amplified with electric amplifiers EAMP1. The output pulses may be optionally shortened e.g. by using the inverting delay lines. One or more optical-to-electrical converter units may optionally comprise an electric amplifier EAMP1 and/or an inverting delay line ED1. In particular, the optical-to-electrical converters may be superconducting nanowire detectors.

Figure 10A:
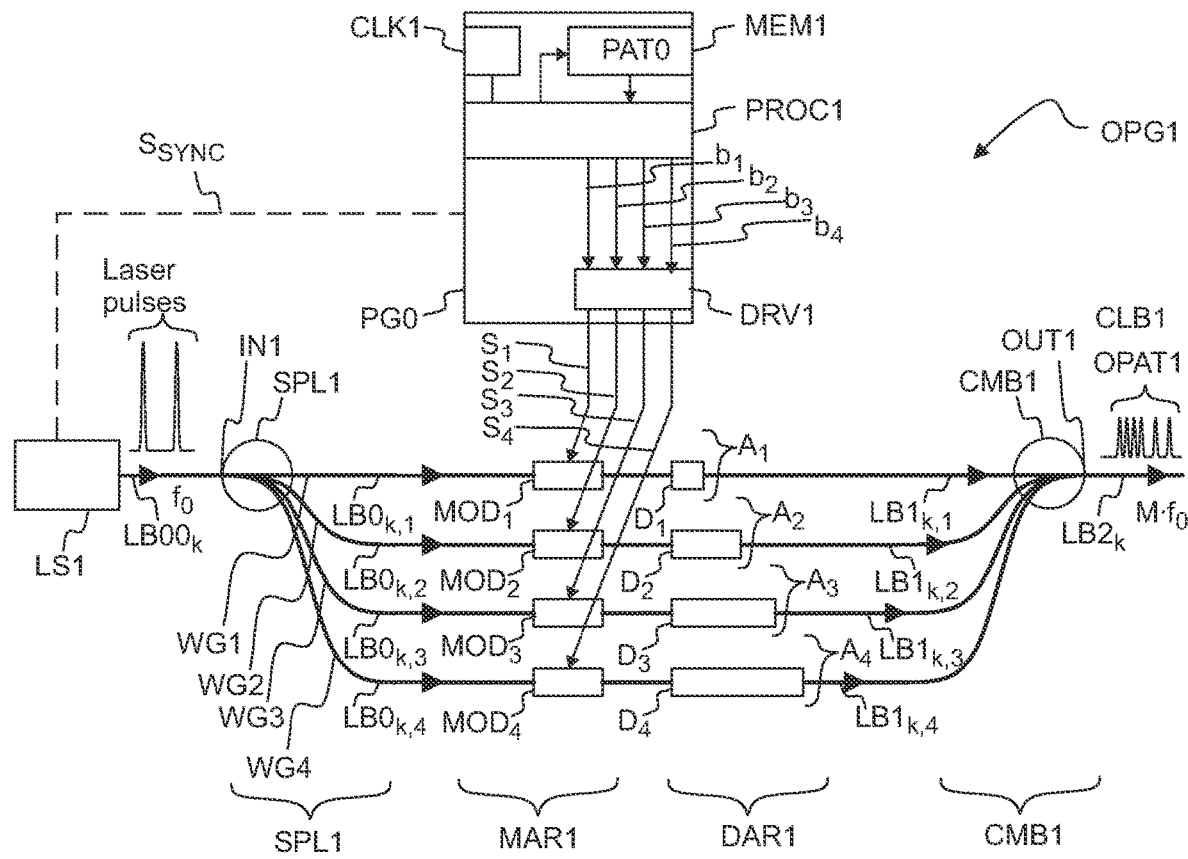
FIG. 10a shows, by way of example, an optical pattern generator device.
Figure 10B:
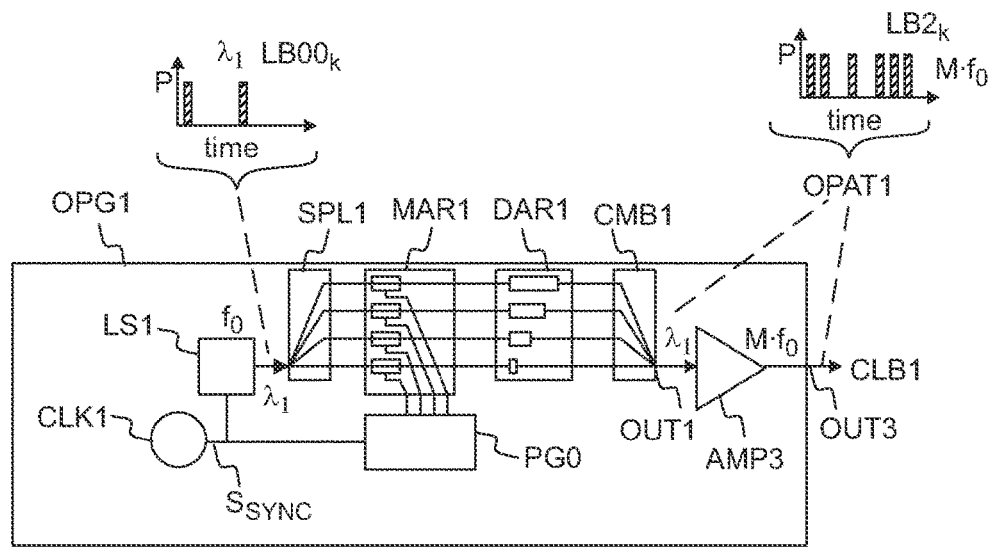
FIG. 10b shows, by way of example, an optical pattern generator device.

Referring to FIGS. 10a and 10b, the optical pattern generator device OPG1 may generate an optical pulse pattern OPAT1 e.g. by a method, which comprises:
  distributing a primary pulse (LB00) to form several secondary pulses (LB0),
  guiding the secondary pulses (LB0) to propagate along different optical branches ($A_1$, $A_2$, $A_3$, $A_4$),
  forming modulated light signals (LB1) by modulating the secondary pulses (LB0) propagating along the different optical branches ($A_1$, $A_2$, $A_3$, $A_4$), delaying the modulated light signals (LB1) or delaying the secondary pulses (LB0) by different delay times ($\Delta t_{D1}$, $\Delta t_{D2}$, $\Delta t_{D3}$, $\Delta t_{D4}$), and
  forming an optical signal (LB2) by combining the delayed modulated signals (LB1) from the different optical branches ($A_1$, $A_2$, $A_3$, $A_4$).

The primary pulses (LB00) may be e.g. laser pulses obtained from a laser light source. The optical pattern generator device OPG1 may comprise e.g. a laser source to provide laser pulses.

The optical pattern generator device OPG1 may comprise one or more distributors SPL1 to distribute the primary pulses (LB00) to form several secondary pulses (LB0). The optical pattern generator device OPG1 may comprise one or more distributors SPL1 to split the primary pulses (LB00) into several secondary pulses (LB0).

The optical pattern generator device OPG1 may comprise an array MAR1 of modulators MOD1, MOS2, MOD3, MOD4 to form modulated light signals (LB1) from the secondary pulses (LB0). The modulators may be e.g. Mach Zehnder modulators. The secondary pulses (LB0) may be guided to the modulators via waveguides WG1, WG2, WG3, WG4.

The optical pattern generator device OPG1 may comprise an array DAR1 of delay lines D1, D2, D3, D4 to provide different delay times ($\Delta t_{D1}$, $\Delta t_{D2}$, $\Delta t_{D3}$, $\Delta t_{D4}$) for the different branches ($A_1$, $A_2$, $A_3$, A4) of the generator device OPG1. The delay lines may be implemented e.g. by waveguides of different lengths.

The optical pattern generator device OPG1 may comprise one or more combiners CMB1 to combine the delayed modulated signals (LB1) from the different optical branches ($A_1$, $A_2$, $A_3$, $A_4$).

Each branch ($A_1$, $A_2$, $A_3$, $A_4$) may comprise an independently controllable modulator (MOD1, MOS2, MOD3, MOD4) and a delay line D1, D2, D3, D4.

An output OUT1 of the combiner CMB1 may provide an optical signal LB2, which comprises the desired arbitrary optical pulse pattern OPAT1. The maximum pulse repetition rate of the optical pulse pattern OPAT1 at the combiner output OUT1 may be equal to $M \cdot f_0$, where $f_0$ denotes the repetition rate of the primary pulses (LB00), and M denotes the number of the branches ($A_1$, $A_2$, $A_3$, $A_4$), which provide signals for said combiner CMB1. The number M of the branches may be e.g. in the range of 4 to 1024.

In an embodiment, the optical output signal LB2 may be coupled as the input signal CLB1 to the optical feedthrough OFEED1 of the cryogenic chamber VES1.

The optical pattern generator device OPG1 may optionally comprise one or more optical amplifiers (AMP3) to amplify the optical power of the optical pulses. In an embodiment, an optical signal obtained from the output (OUT3) of an optical amplifier (AMP3) may be coupled as the input signal CLB1 to the optical feedthrough OFEED1 of the cryogenic chamber VES1.

The optical delay lines (D1, D2, D3, D4) may also be positioned between the distributor SPL1 and the modulators (MOD1, MOD2, MOD3, MOD4).

In an embodiment, the timing of the primary pulses (LB00) may be synchronized with a clock CLK1, e.g. by using a synchronization signal $S_{SYNC}$.

In an embodiment, the timing of the primary pulses (LB00) may even be traceable to a frequency of an atomic clock (CLK1). In an embodiment, the repetition rate of the primary pulses (LB00) may be traceable to an international standard of frequency.

The state of each modulator may be set to a pass state or to a blocking state. In the blocking state the modulator may prevent propagation of an optical pulse. In the pass state the modulator may allow propagation of an optical pulse. Consequently, the modulator may provide an existing optical pulse in the pass state. The modulator may provide a missing optical pulse in the blocking state.

The optical pattern generator device OPG1 may comprise a control unit PG0 to control the states of the modulators. The optical pattern generator device OPG1 may comprise a memory MEM1 for storing a primary pattern PAT0. The control unit PG0 may comprise one or more data processors PROC1 to provide control signals b1, b2, b3, b4 for changing the states of the modulators according to the primary pattern PAT0 and according to the timing signal $S_{SYNC}$. The optical pattern generator device OPG1 may optionally comprise a driving unit DRV1 to amplify the control signals b1, b2, b3, b4, if needed. For example, a driving unit DRV1 may provide high voltage driving signals S1, S2, S3, S4 for the modulators based on the control signals b1, b2, b3, b4, if needed.

Each modulator may be modulated with a frequency, which is smaller than or equal to the repetition rate of the primary optical pulses LB00.

The maximum modulation frequency of each modulator (MOD1, MOS2, MOD3, MOD4) may be equal to the repetition rate $f_0$ of the primary pulses (LB00). The repetition rate $f_0$ of the primary pulses (LB00) may be e.g. smaller than 10 GHz, or even smaller than 1 GHz. Even when generating an arbitrary waveform, it is not necessary to change the state of an individual modulator at a rate which is higher than $f_0$. Consequently, the maximum pulse repetition rate of the optical pulse pattern OPAT1 may be higher than the maximum modulation rate of each individual modulator.

Figure 11A:
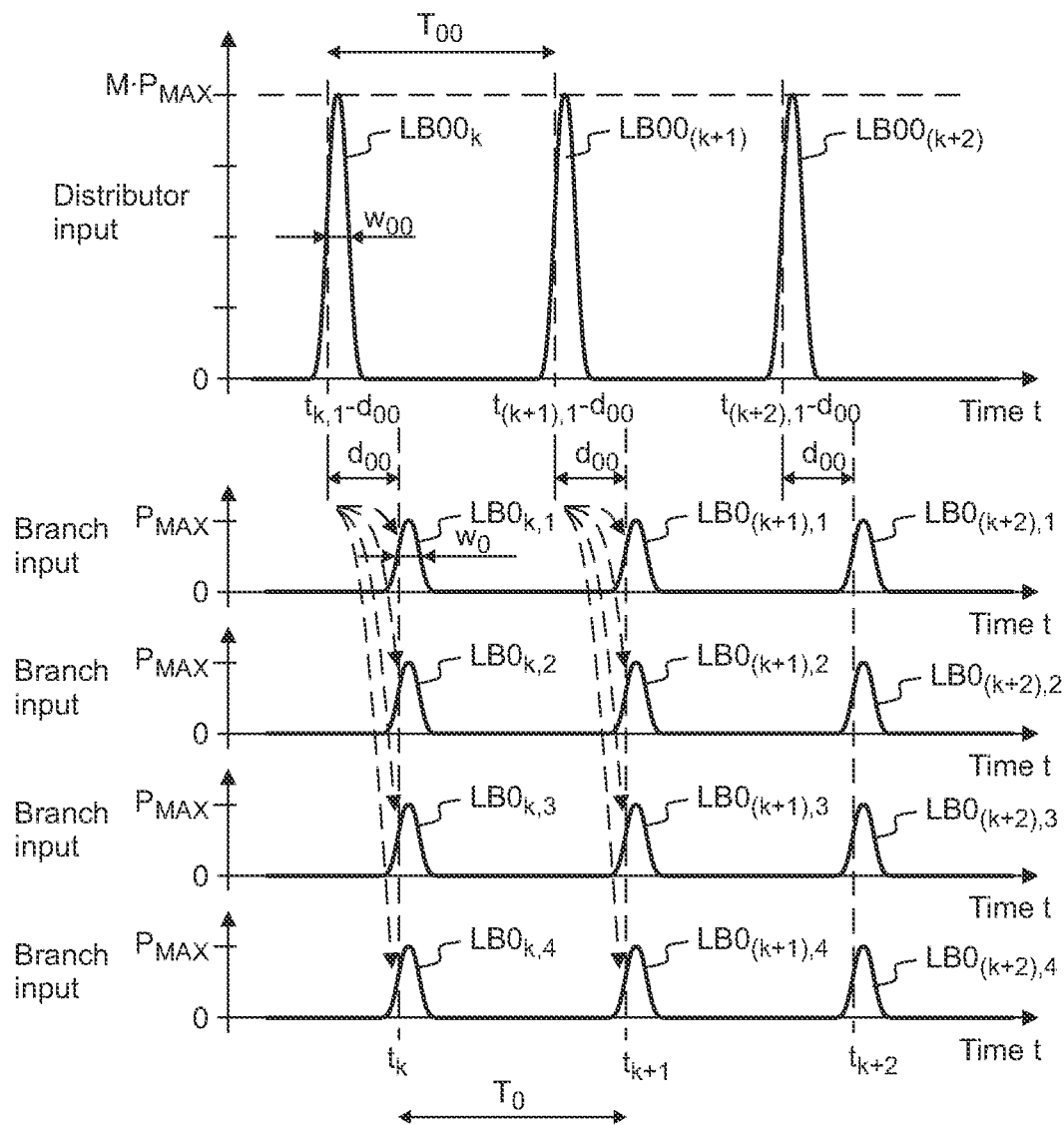
FIG. 11a shows, by way of example, forming optical pulses, which propagate along the arms of the optical pattern generator device.

Referring to FIG. 11a, a light source LS1 of the optical pattern generator device OPG1 may provide a sequence of primary light pulses LB00 at a repetition rate $f_0$ (=$1/T_{00}$). A distributor (SPL1) may form several secondary pulses LB0 from a single primary light pulse LB00, and the distributor (SPL1) may guide the secondary pulses LB0 to propagate along different branches (A1, A2, A3, A4) of the optical pattern generator device OPG1. The repetition rate of the secondary pulses of an individual branch may be equal to the repetition rate ($f_0$) of the primary light pulses LB00.

Too may denote the time period between consecutive primary pulses $LB00_k$, $LB00_{k+1}$. The pulse repetition frequency $f_0$ of the primary pulses LB00 may be equal to $1/T_{00}$. $w_{00}$ may denote temporal width of the primary pulses LB00. To may denote the time period between consecutive secondary pulses $LB0_k$, $LB0_{k+1}$. The pulse repetition frequency $f_0$ of the secondary pulses LB0 may be equal to $1/T_0$. The pulse repetition frequency of the secondary pulses LB0 may be equal to the pulse repetition frequency $f_0$ of the primary pulses LB00. $w_0$ may denote temporal width of the secondary pulses LB0. The symbol P may denote optical power of a pulse. $d_{00}$ may denote a propagation delay. The primary pulses LB00 may be distributed to the branches of the optical pattern generator device OPG1 so as to form the secondary pulses LB0.

Figure 11B:
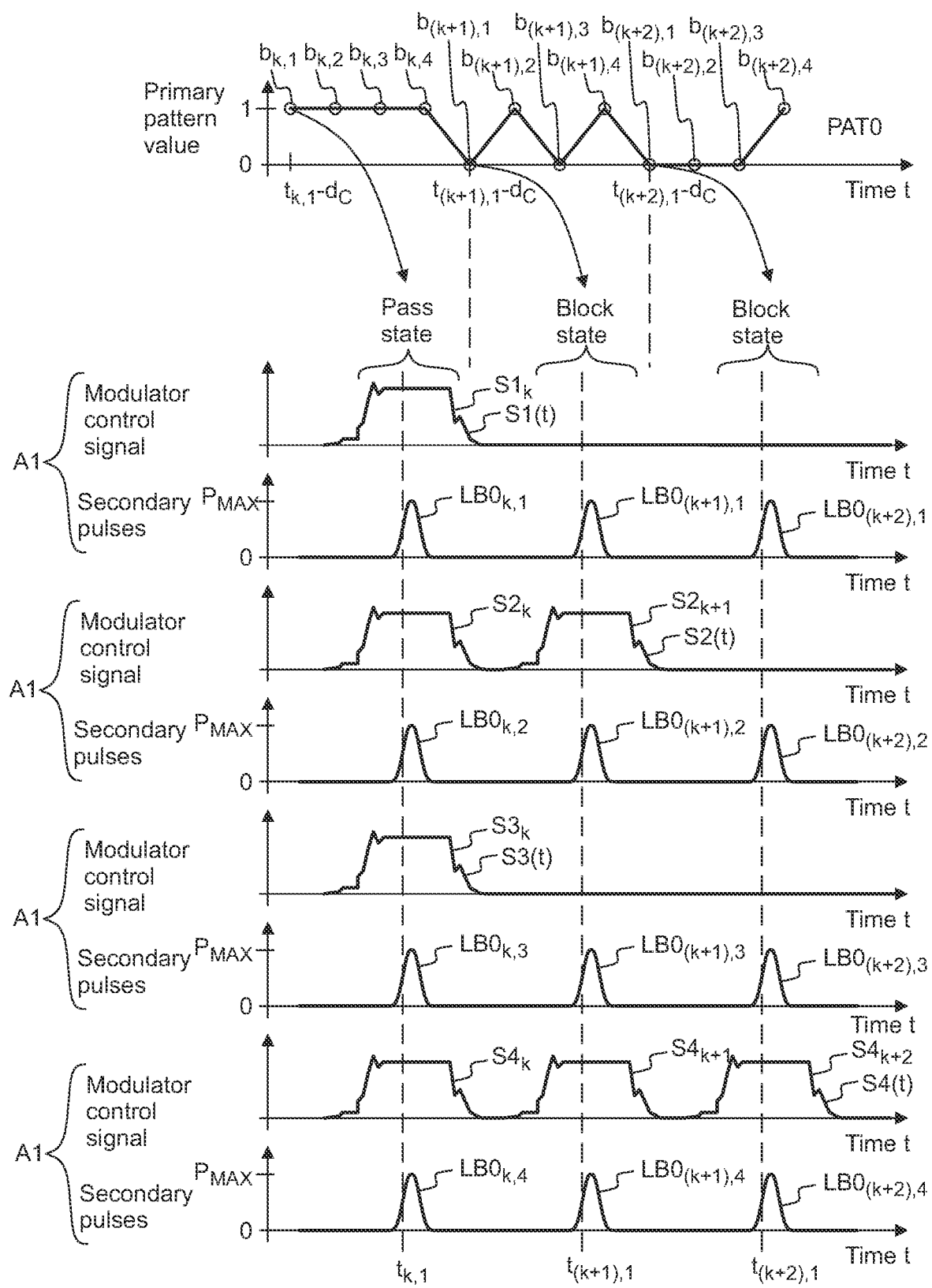
FIG. 11b shows, by way of example, modulating the power of the optical pulses, which propagate along the arms of the optical pattern generator device.
Figure 11C:
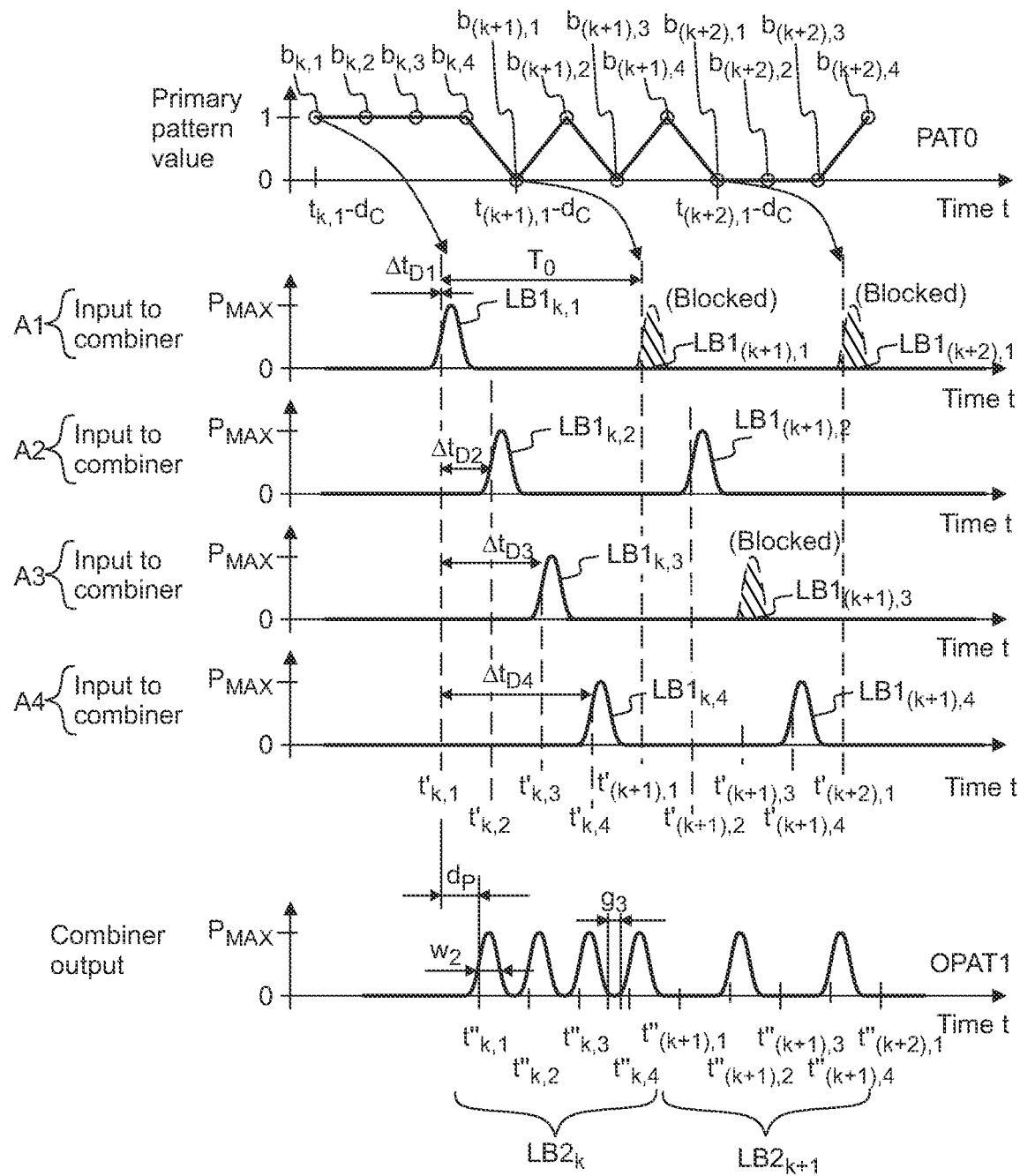
FIG. 11c shows, by way of example, forming an optical pulse pattern by combining the modulated pulses from the arms of the optical pattern generator device.

Referring to FIGS. 11b and 11c, the modulator (MOD) of each branch (A) may form a modulated optical signal from the secondary pulses LB0 arriving at the modulator (MOD), by allowing a pulse to pass or by blocking the pulse. The state of each modulators may be controlled according to a primary pattern PAT0. The primary pattern PAT0 may be read e.g. from a memory MEM1. The primary pattern PAT0 may be read e.g. from a computer-readable memory MEM1 of the control unit PG0 of the optical pattern generator device OPG1. The primary pattern PAT0 may be defined e.g. by a sequence of values $b_{k,1}$, $b_{k,2}$, $b_{k,3}$, $b_{k,4}$, $b_{k+1,1}$, $b_{k+1,2}$, $b_{k+1,3}$, $b_{k+1,4}$. Control signals S1, S2, S3, S4 may be formed according to the values $b_{k,1}$, $b_{k,2}$, $b_{k,3}$, $b_{k,4}$, $b_{k+1,1}$, $b_{k+1,2}$, $b_{k+1,3}$, $b_{k+1,4}$ of the primary pattern PAT0, and the state of each modulator may be set to the pass state or to the blocking state according to the control signals S1, S2, S3, S4. $d_C$ may denote an advance time between reading a value of the primary pattern PAT0 and arrival time of an optical pulse to a modulator.

In an embodiment, the primary pattern PAT0 may also be obtained e.g. from a data communication pathway. In an embodiment, the primary pattern PAT0 may be determined according to data obtained from a data communication pathway.

Referring to FIG. 11c, the secondary pulses LB0 or the modulated signals propagating along each branch of the optical pattern generator device OPG1 may be delayed by different delay times $\Delta t_{D1}$, $\Delta t_{D2}$, $\Delta t_{D3}$, $\Delta t_{D4}$. The delayed optical signals obtained from the different branches may be combined to form an optical pulse pattern OPAT1. The maximum repetition rate of the pulses of the pulse pattern OPAT1 may be equal to $M \cdot f_0$, where M denotes the number of the branches combined at the output, and $f_0$ denotes the repetition rate of the primary pulses LB00. $d_p$ may denote a propagation delay. $w_2$ may denote the width of optical pulses of the optical pulse pattern. $g_3$ may denote a time period between consecutive pulses of an optical pulse pattern.

Figure 12:
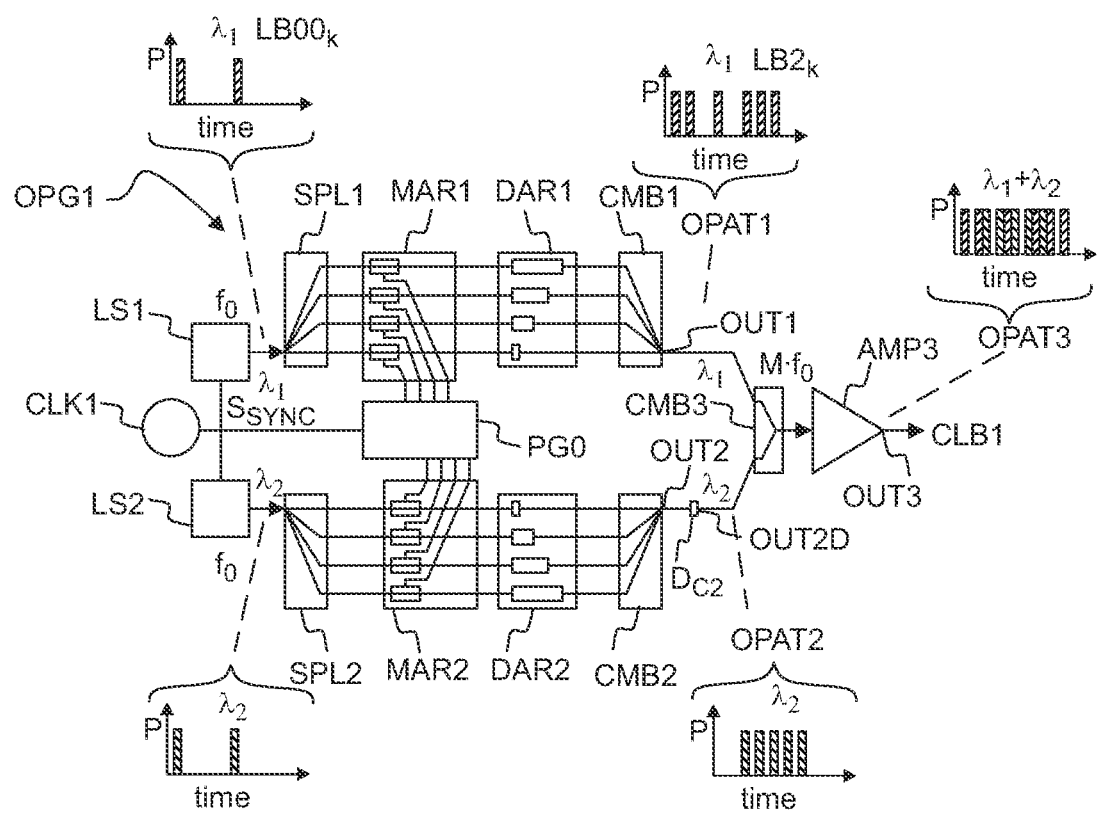
FIG. 12 shows, by way of example, an optical pattern generator device, which provides optical pulses at two different wavelengths.

Referring to FIG. 12, the optical pattern generator device OPG1 may be arranged to provide a first optical pulse pattern OPAT1 at a first wavelength $\lambda_1$, and a second optical pulse pattern OPAT2 at a second wavelength $\lambda_2$. The second optical pulse pattern OPAT2 may be synchronized and/or interlaced with the first optical pulse pattern OPAT1.

The generator device OPG1 may comprise a first light source LS1 to provide primary light pulses LB00 at the first wavelength $\lambda_1$, and a second light source LS2 to provide primary light pulses LB00 at the second wavelength $\lambda_2$. The operation of the second light source LS1 may be synchronized with the operation of the first light source LS1 by using a synchronization signal $S_{SYNC}$.

A first distributor SPL1 may form secondary light pulses LB0 from the primary pulses LB00 of the first light source LS1, and may guide the secondary light pulses LB0 to propagate along a first group of branches. The secondary pulses propagating along each branch of the first group may be modulated, delayed, and combined to form the first optical pulse pattern OPAT1.

A second distributor SPL2 may form secondary light pulses LB0 from the primary pulses LB00 of the second light source LS2, and may guide the secondary light pulses LB0 to propagate along a second group of branches. The secondary pulses propagating along each branch of the second group may be modulated, delayed, and combined to form the second optical pulse pattern OPAT2. The optical pulse patterns OPAT1, OPAT2 may be combined to form a wavelength-multiplexed optical signal CLB1, which comprises the optical pulse patterns OPAT1, OPAT2. The optical pattern generator device OPG1 may optionally comprise one or more optical amplifiers to amplify the wavelength-multiplexed optical signal CLB1.

The second distributor SPL2 may form secondary light pulses LB0 from the primary pulses LB00 of the second light source LS2. The secondary light pulses LB0 may be modulated by a second array MAR2 of modulators. A second array DAR2 of delay lines may provide different delay times for the different branches. An output OUT2 of a second combiner CMB2 may provide an optical signal by combining optical pulses from the different branches. The generator device OPG1 may optionally comprise a delay line $D_{C2}$ for delaying the second pulse pattern PAT2 with respect to the first pulse pattern PAT1. The delay line $D_{C2}$ may have an output OUT2D to provide a delayed pulse pattern.

In an embodiment, the optical pattern generator device OPG1 may also be implemented e.g. by obtaining an electrical signal from an electrical arbitrary waveform generator, and by converting the electrical signal into a sequence of optical pulses e.g. by modulating the output of a laser. For example, the output of a laser diode may be modulated according to an electrical signal produced by an electrical arbitrary waveform generator. In that case the properties of the optical pulses may be limited by the properties of the electrical signal from the electrical arbitrary waveform generator.

In an embodiment, the method may comprise changing the amplitude of the electrical pulses formed by converting optical pulses into the electrical pulses. The method may comprise changing the amplitude of the electrical pulses e.g. by changing a bias voltage or bias current of an optical-to-electrical converter unit. The method may comprise changing the amplitude of the electrical pulses e.g. by changing amplitude of the optical pulses. Changing the amplitude of the produced electrical pulses may provide an increased dynamic range.

Various aspects are illustrated by the following examples:

Example 1. A method for providing an electric waveform (V(t), EPAT1, $V_{F1}$ (t)), the method comprising:
  providing a first optical signal (CLB1), which comprises one or more sequences (OPAT1, OPAT2) of optical pulses,
  guiding the first optical signal (CLB1) into a cryogenic chamber (VES1),
  distributing the optical pulses of the first optical signal (CLB1) via optical waveguides (CWG1, CWG2) to two or more optical-to-electrical converter devices (OEC1, OEC2), and
  converting the optical pulses of the first optical signal (CLB1) into electric pulses inside the cryogenic chamber (VES1), wherein the temperature ($T_1$) inside the cryogenic chamber (VES1) is lower than 20 K.

Example 2. The method of example 1, comprising forming an arbitrary electric waveform (V(t), EPAT1, $V_{F1}$(t)) from the electric pulses so that the voltage level of the arbitrary electric waveform (V(t), EPAT1, $V_{F1}$(t)) is proportional to the frequency of the optical pulses.

Example 3. The method of example 1 or 2, wherein the optical waveguides (CWG1, CWG2) are implemented on a substrate (SUB1).

Example 4. The method according to any of examples 1 to 3, comprising forming the first optical signal (CLB1) by a method, which comprises:
  distributing a primary pulse (LB00) to form several secondary pulses (LB0),
  guiding the secondary pulses (LB0) to propagate along different optical branches (A1, A2),
  forming modulated light signals (LB1) by modulating the secondary pulses (LB0) propagating along the different optical branches (A1, A2),
  delaying the modulated light signals (LB1) or delaying the secondary pulses (LB0) by different delay times ($\Delta t_{D1}$, $\Delta t_{D2}$), and
  forming an optical signal (LB2) by combining the delayed modulated light signals (LB1) from the different optical branches (A1, A2).

Example 5. The method according to any of examples 1 to 4, comprising forming a filtered electric waveform ($V_{F1}$ (t)) by low pass filtering from electric pulses obtained from one or more optical-to-electrical converter devices (OEC1).

Example 6. The method according to any of examples 1 to 5, comprising obtaining electric pulses from two or more optical-to-electrical converter devices (OEC1, OEC2), which are connected in series.

Example 7. The method according to any of examples 1 to 6, wherein a pulse repetition rate of the optical pulses of the first optical signal (CLB1) is higher than 40 GHz.

Example 8. The method according to any of examples 1 to 7, comprising guiding a first sequence (OPAT1) of optical pulses of the first optical signal (CLB1) to a first optical-to-electrical converter device (OEC1), guiding a second sequence (OPAT2) of optical pulses of the first optical signal (CLB1) to a second optical-to-electrical converter device (OEC2), using the first optical-to-electrical converter device (OEC1) to convert the first sequence (OPAT1) of optical pulses (OPAT1) into first voltage pulses ($V_1$(t)), using the second optical-to-electrical converter device (OEC2) to convert the second sequence (OPAT2) of optical pulses (OPAT2) into second voltage pulses ($V_2$(t)), wherein the method comprises forming a combined signal ($V_{S1}$(t)) by combining the first voltage pulses ($V_1$(t)) with the second voltage pulses ($V_2$(t)).

Example 9. The method according to any of examples 1 to 8, comprising guiding a first sequence (OPAT1) of optical pulses of the first optical signal (CLB1) to a first optical-to-electrical converter device (OEC1), guiding a second sequence (OPAT2) of optical pulses of the first optical signal (CLB1) to a second optical-to-electrical converter device (OEC2), using the first optical-to-electrical converter device (OEC1) to convert the first sequence (OPAT1) of optical pulses (OPAT1) into first voltage pulses ($V_1$(t)), using the second optical-to-electrical converter device (OEC2) to convert the second sequence (OPAT2) of optical pulses (OPAT2) into second voltage pulses ($V_2$(t)), and providing first voltage pulses ($V_1$(t)) from a first output (OUT1), and providing the second voltage pulses ($V_2$(t)) from a second output (OUT2).

Example 10. The method of example 8 or 9, wherein the first sequence (OPAT1) has a first wavelength ($\lambda_1$), and the second sequence (OPAT2) has a second different wavelength ($\lambda_2$).

Example 11. The method according to any of examples 1 to 10, wherein the optical pulses are converted into electric pulses by using one or more superconducting nanowire detectors (OEC1), which are arranged to detect single photons and/or multiple photons.

Example 12. The method according to any of examples 1 to 11, comprising forming an electric waveform ($V_{S1}(t)$, EPAT1) by combining electric pulses obtained from two or more optical-to-electrical converter devices (OEC1, OEC2), wherein the operation of at least one optical-to-electrical converter device (OEC1, OEC2) is selectively enabled and disabled by a control signal ($S_{SUP1}$).

Example 13. The method according to any of examples 1 to 12, comprising shortening the width of an electric pulse by adding a delayed inverted pulse.

Example 14. An apparatus (1000), comprising:
an optical pattern generator device (OPG1) to provide a first optical signal (CLB1), which comprises one or more sequences (OPAT1, OPAT2) of optical pulses,
a cryogenic chamber (VES1),
a cooling system (SYS1) arranged to keep an internal temperature ($T_1$) of the cryogenic chamber (VES1) lower than 20 K,
an optical feedthrough (OFEED1) to guide the first optical signal (CLB1) into the cryogenic chamber (VES1),
one or more distributors (CSPL1) to distribute the optical pulses of the first optical signal (CLB1) via optical waveguides (CWG1, CWG2) to two or more optical-to-electrical converter devices (OEC1, OEC2), and
one or more optical-to electrical converter units (OEU1) to convert the optical pulses of the first optical signal (CLB1) into electric pulses ($V_1(t)$) inside the cryogenic chamber (VES1).

For the person skilled in the art, it will be clear that modifications and variations of the devices and methods according to the present disclosure are perceivable. The figures are schematic. The particular embodiments described above with reference to the accompanying drawings are illustrative only and not meant to limit the scope of the present disclosure, which is defined by the appended claims.

The invention claimed is:

1. A method for providing an electric waveform, the method comprising:
providing a first optical signal, which comprises one or more sequences of optical pulses,
guiding the first optical signal into a cryogenic chamber,
distributing the optical pulses of the first optical signal via optical waveguides to two or more optical-to-electrical converter devices, and
converting the optical pulses of the first optical signal into electric pulses inside the cryogenic chamber by using the optical-to-electrical converter devices,
wherein an internal temperature inside the cryogenic chamber is lower than 20 Kelvin.

2. The method of claim 1 comprising forming an arbitrary electric waveform from the electric pulses so that a voltage level of the arbitrary electric waveform is proportional to a frequency of the optical pulses.

3. The method of claim 1, comprising forming an electric waveform from the electric pulses by low pass filtering so that a voltage level of the electric waveform is proportional to a frequency of the optical pulses, wherein an output of one or more of the optical-to-electrical converter devices is connected to a resistor for impedance matching.

4. The method of claim 1, wherein the optical waveguides are implemented on a substrate.

5. The method according to claim 1, comprising forming the first optical signal by a method, which comprises:
distributing a primary pulse to form several secondary pulses,
guiding the secondary pulses to propagate along different optical branches,
forming modulated light signals by modulating the secondary pulses propagating along the different optical branches,
delaying the modulated light signals or delaying the secondary pulses by different delay times, and
forming an optical signal by combining the delayed modulated light signals from the different optical branches.

6. The method according to claim 1, comprising obtaining electric pulses from two or more optical-to-electrical converter devices, which are connected in series.

7. The method according to claim 1, wherein a pulse repetition rate of the optical pulses of the first optical signal is higher than 40 GHz.

8. The method according to claim 1, comprising guiding a first sequence of optical pulses of the first optical signal to a first optical-to-electrical converter device, guiding a second sequence of optical pulses of the first optical signal to a second optical-to-electrical converter device, using the first optical-to-electrical converter device to convert the first sequence of optical pulses into first voltage pulses, using the second optical-to-electrical converter device to convert the second sequence of optical pulses into second voltage pulses, wherein the method comprises forming a combined signal by combining the first voltage pulses with the second voltage pulses.

9. The method according to claim 1, comprising guiding a first sequence of optical pulses of the first optical signal to a first optical-to-electrical converter device, guiding a second sequence of optical pulses of the first optical signal to a second optical-to-electrical converter device, using the first optical-to-electrical converter device to convert the first sequence of optical pulses into first voltage pulses, using the second optical-to-electrical converter device to convert the second sequence of optical pulses into second voltage pulses, and providing first voltage pulses from a first output, and providing the second voltage pulses from a second output.

10. The method of claim 9, wherein the first sequence has a first wavelength, and the second sequence has a second different wavelength.

11. The method according to claim 1, wherein the optical pulses are converted into electric pulses by using one or more superconducting nanowire detectors, which are arranged to detect single photons and/or multiple photons.

12. The method according to claim 1, comprising forming an electric waveform by combining electric pulses obtained from two or more optical-to-electrical converter devices, wherein the operation of at least one optical-to-electrical converter device is selectively enabled and disabled by a control signal.

13. The method according to claim 1, comprising shortening a width of an electric pulse by adding a delayed inverted pulse.

14. An apparatus, comprising:
an optical pattern generator device to provide a first optical signal, which comprises one or more sequences of optical pulses,
a cryogenic chamber,
a cooling system arranged to keep an internal temperature of the cryogenic chamber lower than 20 Kelvin,
an optical feedthrough to guide the first optical signal into the cryogenic chamber,
one or more distributors to distribute the optical pulses of the first optical signal via optical waveguides to two or more optical-to-electrical converter devices, and one or more optical-to electrical converter units to convert the optical pulses of the first optical signal into electric pulses inside the cryogenic chamber.

15. The apparatus of claim 14, being arranged to form an electric waveform from the electric pulses by low pass filtering so that the voltage level of the electric waveform is proportional to the frequency of the optical pulses, wherein an output of one or more of the optical-to-electrical converter devices is connected to a resistor for impedance matching.

* * * * *